US009345156B2

(12) United States Patent
Ogura et al.

(10) Patent No.: US 9,345,156 B2
(45) Date of Patent: May 17, 2016

(54) POWER SUPPLY DEVICE

(75) Inventors: Masayuki Ogura, Hitachinaka (JP);
Shinji Watanabe, Hitachinaka (JP);
Haruhisa Fujisawa, Hitachinaka (JP);
Kazuhiko Funabashi, Hitachinaka (JP);
Takuhiro Murakami, Hitachinaka (JP);
Yasushi Nakano, Hitachinaka (JP);
Hideki Watanabe, Hitachinaka (JP);
Norihide Tao, Hitachinaka (JP);
Takafumi Itoh, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 119 days.

(21) Appl. No.: 14/130,517

(22) PCT Filed: Aug. 17, 2012

(86) PCT No.: PCT/JP2012/005184
§ 371 (c)(1),
(2), (4) Date: Jan. 2, 2014

(87) PCT Pub. No.: WO2013/027377
PCT Pub. Date: Feb. 28, 2013

(65) Prior Publication Data
US 2014/0153171 A1 Jun. 5, 2014

(30) Foreign Application Priority Data

Aug. 23, 2011 (JP) ................................ 2011-182058
Aug. 23, 2011 (JP) ................................ 2011-182059
Aug. 23, 2011 (JP) ................................ 2011-182060
Aug. 23, 2011 (JP) ................................ 2011-182061

(51) Int. Cl.
*H02J 7/00* (2006.01)
*H05K 5/02* (2006.01)
(Continued)

(52) U.S. Cl.
CPC .............. *H05K 5/023* (2013.01); *H02J 7/0042* (2013.01); *H02J 7/0044* (2013.01); *H02J 7/0065* (2013.01); *H02M 7/003* (2013.01); *H05K 5/0086* (2013.01); *H02J 7/0063* (2013.01)

(58) Field of Classification Search
CPC ............. H05K 5/023; H01M 2/10; H02J 7/00
USPC .................................................. 320/112, 114
See application file for complete search history.

(56) References Cited

U.S. PATENT DOCUMENTS

| 5,111,127 A | 5/1992 | Johnson |
| 5,616,968 A * | 4/1997 | Fujii ......................... H02J 3/38 307/150 |

(Continued)

FOREIGN PATENT DOCUMENTS

| CN | 100414773 C | 3/2006 |
| JP | 44-000007 Y1 | 1/1969 |

(Continued)

OTHER PUBLICATIONS

Japan Patent Office office action for patent application JP2011-182059 (May 7, 2015).
(Continued)

*Primary Examiner* — M'Baye Diao
(74) *Attorney, Agent, or Firm* — Kilpatrick Townsend & Stockton LLP

(57) ABSTRACT

A power supply device includes a main body, a cover member, a rechargeable battery, and an inverter device. The main body is configured of box-shape formed with an opening. The cover member is configured to open and close the opening. The rechargeable battery is accommodated in the main body. The inverter device is configured to be accommodated in the main body. The inverter device converts a direct voltage from the battery to an alternating voltage and outputs the alternating voltage.

6 Claims, 30 Drawing Sheets

(51) Int. Cl.
*H02M 7/00* (2006.01)
*H05K 5/00* (2006.01)

(56) References Cited

U.S. PATENT DOCUMENTS

| | | | |
|---|---|---|---|
| 7,573,232 B2 * | 8/2009 | Cheng | H02J 7/0045 307/64 |
| 7,652,900 B2 | 1/2010 | Fukaya et al. | |
| 7,913,978 B1 * | 3/2011 | Trihey et al. | 254/323 |
| 8,178,229 B2 | 5/2012 | Marukawa et al. | |
| 2001/0043052 A1 | 11/2001 | Griffey et al. | |
| 2004/0121225 A1 | 6/2004 | Krieger et al. | |
| 2005/0092603 A1 * | 5/2005 | Nemoto et al. | 204/298.12 |
| 2005/0156564 A1 | 7/2005 | Krieger | |
| 2005/0162132 A1 * | 7/2005 | Nagasawa | H02J 9/061 320/128 |
| 2006/0042679 A1 * | 3/2006 | Choi | H02S 40/38 136/244 |
| 2006/0193158 A1 | 8/2006 | Fukaya et al. | |
| 2006/0215299 A1 * | 9/2006 | Kao et al. | 360/69 |
| 2007/0019453 A1 | 1/2007 | Pierce | |
| 2007/0252435 A1 * | 11/2007 | Coe | H02J 7/1423 307/10.1 |
| 2008/0018303 A1 * | 1/2008 | Scheucher | H01M 2/1072 320/128 |
| 2008/0029153 A1 * | 2/2008 | Margalit | A45C 13/02 136/252 |
| 2008/0079390 A1 * | 4/2008 | Hulden | 320/105 |
| 2008/0085445 A1 | 4/2008 | Marukawa et al. | |
| 2011/0049979 A1 * | 3/2011 | Yen | H02J 7/00 307/10.1 |
| 2011/0101780 A1 * | 5/2011 | Johnson | H01M 2/1022 307/66 |
| 2011/0101794 A1 | 5/2011 | Schroeder et al. | |
| 2011/0101909 A1 * | 5/2011 | Bowman | H02J 7/0054 320/103 |
| 2012/0025766 A1 * | 2/2012 | Reade et al. | 320/110 |

FOREIGN PATENT DOCUMENTS

| | | |
|---|---|---|
| JP | 48-037317 U | 5/1973 |
| JP | 50-134826 U | 11/1975 |
| JP | 53-028008 U | 3/1978 |
| JP | 53-160719 U | 12/1978 |
| JP | 58-044245 U | 3/1983 |
| JP | 60-048668 U | 4/1985 |
| JP | 01-080759 U | 5/1989 |
| JP | 06-009386 U | 2/1994 |
| JP | 08-126226 A | 5/1996 |
| JP | 11-075925 A | 3/1999 |
| JP | 3079288 U | 8/2001 |
| JP | 2004-058697 A | 2/2004 |
| JP | 2004-120936 A | 4/2004 |
| JP | 2006-140022 A | 6/2006 |
| JP | 2006-217780 A | 8/2006 |
| JP | 2006-296109 A | 10/2006 |
| JP | 2007-015032 A | 1/2007 |
| JP | 2008-097850 A | 4/2008 |
| JP | 2009-278832 A | 11/2009 |
| JP | 2010-086885 A | 4/2010 |
| JP | 2010-123281 A | 6/2010 |
| JP | 2012-253838 A | 12/2012 |
| WO | WO2008/010801 A2 | 1/2008 |

OTHER PUBLICATIONS

Japan Patent Office office action for patent application JP2011-182060 (May 7, 2015).
Japan Patent Office office action for patent application JP2011-182058 (Apr. 30, 2015).
Japan Patent Office office action for patent application JP2011-182061 (Apr. 30, 2015).
International Search Report for application PCT/JP2012/005184 (May 14, 2013).
International Report on Patentability for application PCT/JP2012/005184 (Mar. 6, 2014), 6 pages.
Chinese Patent Application No. 2012800402827, The Notification of the First Office Action, mailed Aug. 26, 2015 along with English translation.

* cited by examiner

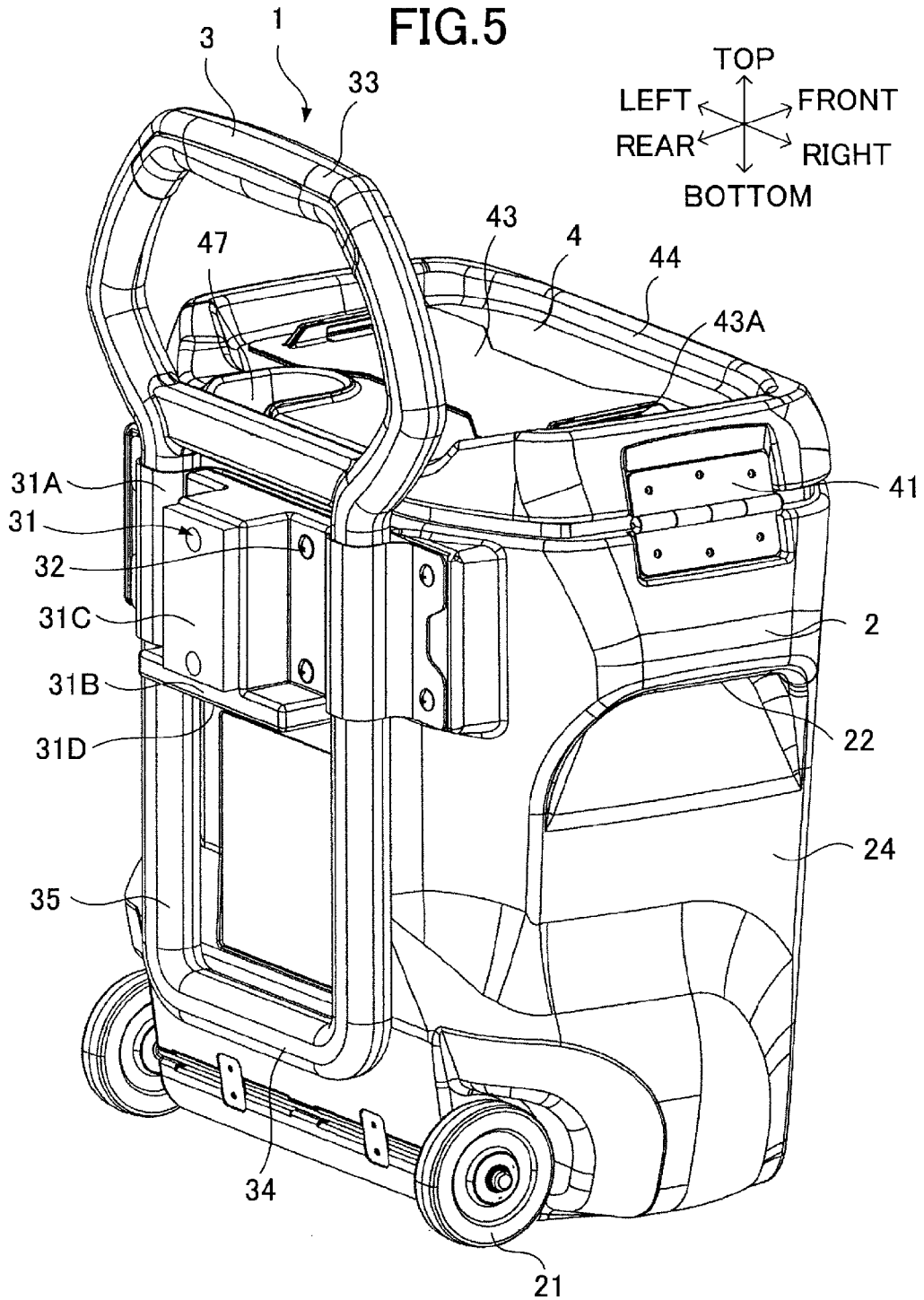

FIG.6C
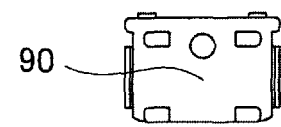
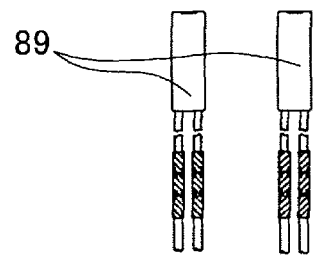
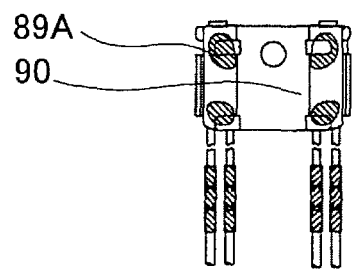

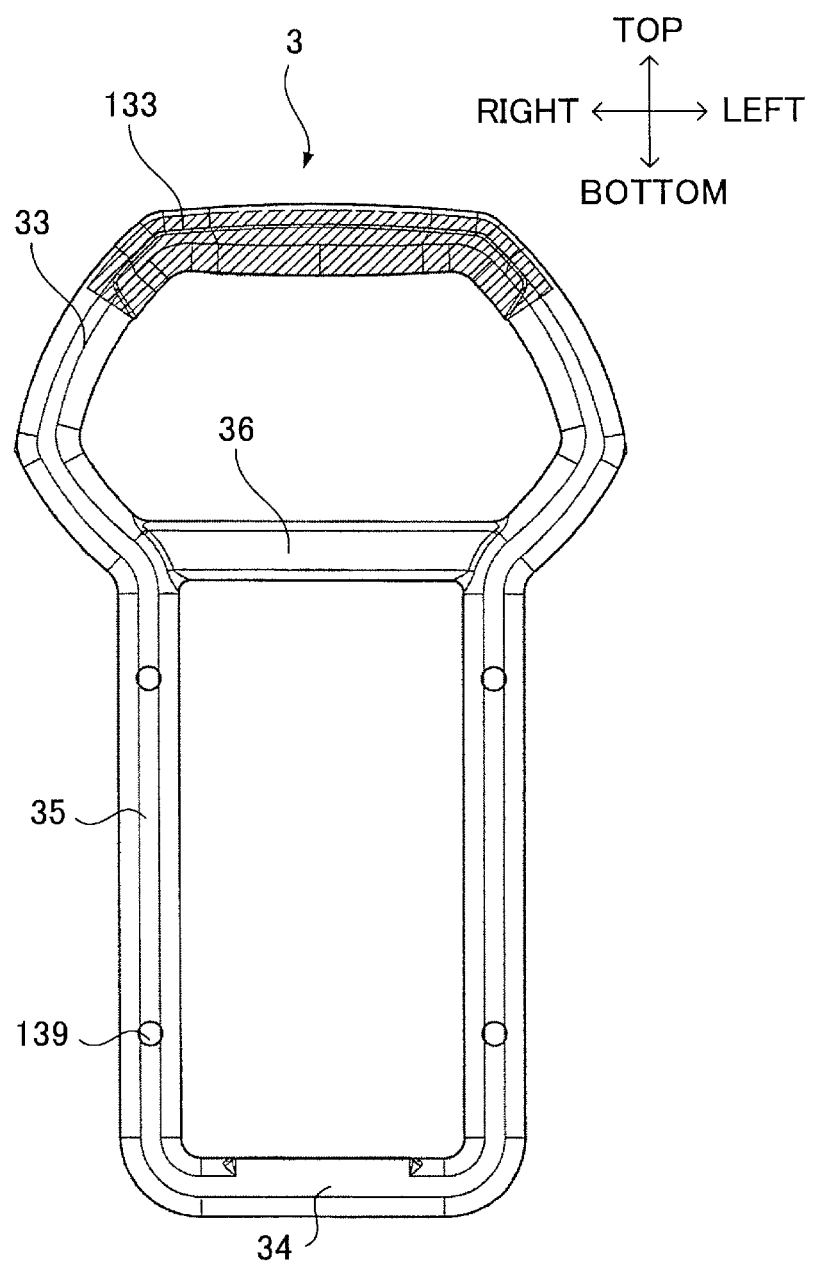

POWER SUPPLY DEVICE

TECHNICAL FIELD

The invention relates to a power supply device.

BACKGROUND ART

There is an increase in demand for an emergency power supply device in preparation for a situation in which a power failure has occurred due to an earthquake, a disaster, etc. (For example, refer to Japanese Patent Application Publication No. 2009-278832)

DISCLOSURE OF INVENTION

Solution to Problem

In particular, there is a demand for a high-capacity emergency power supply device that can be used for a long period of time. An emergency power supply device for outputting 100V AC voltage has various devices such as an inverter device as well as a battery.

It is an object of the invention to provide a power supply device that can integrally convey the various devices and can be used for a long period of time.

In order to attain above and other objects, the present invention provides a power supply device. The power supply device includes a main body, a cover member, a rechargeable battery, and an inverter device. The main body is configured of box-shape formed with an opening. The cover member is configured to open and close the opening. The battery is accommodated in the main body. The inverter device is configured to be accommodated in the main body. The inverter device converts a direct voltage from the battery to an alternating voltage and outputs the alternating voltage.

It is preferable that the inverter device converts the direct voltage from the battery to a square-wave alternating voltage and outputs the square-wave alternating voltage. The power supply device further includes a sine-wave adapter configured to convert the square-wave alternating voltage outputted from the inverter device to a sine-wave alternating voltage and output the sine-wave alternating voltage. The sine-wave adapter is capable of being accommodated in the main body.

It is preferable that the cover member includes a fixing section on which the inverter device is fixable.

It is preferable that the inverter device includes an engagement section and the fixing section comprises an engaging section engageable with the engagement section.

It is preferable that the cover member has an outer surface from which the fixing section protrudes. The cover member further includes a protruding section protruding more than the fixing section from the outer surface.

It is preferable that the protruding section has a peripheral portion provided with the protruding section and formed with a flat section having the same level as the outer surface of the cover member. The outer surface of the cover member is slanted downward toward the flat section.

It is preferable that the outer surface is slanted downward at least 1 degree toward the flat section.

It is preferable that the cover member is a generally rectangular shape having four sides and is pivotally movable relative to the main body at one of the four sides. The cover member has an inner surface opposed to the outer surface. The cover member is formed with at least one of U-shaped grooves penetrating the outer surface and the inner surface at the remaining side of the four sides.

It is preferable that the cover member includes a protruding wall protruding from the outer surface and provided at an entire periphery of the groove.

It is preferable that the power supply device further includes an adapter configured to connect the inverter device with the battery. The inverter device includes an accommodating section capable of accommodating the adapter and protruding from an outer portion of the inverter device. The cover member has an inner surface opposed to the outer surface. The inner surface of the cover member has an abutment surface in abutment with the adapter for preventing the cover member from being closed when the inverter device is accommodated in the main body and the adapter is accommodated in the accommodating section.

It is preferable that the inverter device is capable of using independently upon separating from the fixing section.

It is preferable that the battery is a lead storage battery.

It is preferable that the lead storage battery is for a vehicle use.

It is preferable that the inverter device is selectively usable as power source either the battery or a battery pack for a power tool.

It is preferable that the power supply device further includes an adapter configured to connect the inverter device with the battery. The adapter includes a connection section connected with the inverter device. The battery pack includes a connecting section connected with the inverter device. A shape of the connecting section is the same as that of the connection section.

It is preferable that the cover member is incapable of closing the opening in a state where the inverter device is connected with the adapter or the battery pack and is accommodated in the main body.

It is preferable that the power supply device further includes a grippable handle for carrying the main body. The main body includes a holding section for holding the handle.

It is preferable that the handle includes a first handle member having a first joint surface, and a second handle member having a second joint surface. The first joint surface and the second joint surface are in abutment with and fixed to each other. The first handle member and the second handle member are half-split shape that is plane-symmetrical with respect to the first and second joint surfaces.

It is preferable that the main body has one end portion where the cover member is provided and another end portion opposed to the one end portion in a longitudinal direction. The handle is movably held on the holding section at a prescribe amount in the longitudinal direction. The main body further includes a stopper in abutment with the handle when the handle is located at an end position in a direction from the other end portion to the one end portion.

It is preferable that the power supply device further includes an elastic member provided at least one of a portion of the handle and a portion of the stopper. The stopper is in abutment with the portion of the handle, and the handle is in abutment with the portion of the stopper.

It is preferable that the main body has an outer surface. The handle is movable along the outer surface. The elastic member is provided from the outer surface to a portion farther than the handle in a separating direction from the main body.

It is preferable that the elastic member is made from rubber damper.

It is preferable that the handle has a top end portion farthest from the main body in the longitudinal direction. When the main body is in an upside down orientation in which the one end portion of the main body is positioned at bottom side and the other end portion of the main body is positioned at top side, the top end portion and a center of gravity of the power supply device each projected to a plane perpendicular to the longitudinal direction are away from each other such that the power supply device is incapable of stably maintaining the upside down orientation.

It is preferable that the handle is disposed at an outer surface of the main body and is movable between a most retracted position retracted along the outer surface and a most extended position extending from the main body. The handle has a top end portion farthest from the main body in a longitudinal direction of the main body. The top end portion is located at a position higher than a top portion of the inverter device in a state where the inverter device is fixed on the cover member and the handle is at the most retracted position.

It is preferable that the power supply device further includes a wheel rotatably supported on the main body to be capable of carrying the main body.

It is preferable that the power supply device further includes a middle cover provided in the main body and dividing a space within the main body into an upper chamber and a lower chamber. The battery is accommodated at the lower chamber and the inverter device is capable of being accommodated in the upper chamber.

It is preferable that the middle cover includes a receiving section for receiving the inverter device. The inverter device is held by the cover member and the receiving section upon being accommodated in the main body.

It is preferable that the power supply device further includes an adapter configured to connect the inverter device with the battery. The middle cover includes an accommodating portion configured to accommodate the adapter and positioned lower than the receiving section.

It is preferable that the inverter device is capable of being received on the middle cover in a state where the adapter is connected to the inverter device.

It is preferable that the main body includes an inner body defining a space within the main body, and an outer body constituting an outer shell of the main body. The power supply device further includes a grippable handle for carrying the main body. The main body further includes a holding section for holding the handle. The inverter device is capable of being accommodated in the upper chamber in a state where the inverter device is received on the middle cover. The inner body includes a concave section located at a position confronting the inverter device and depressed outward from the main body. The holding section is fixed at the concave section.

It is preferable that the inverter device converts the direct voltage from the battery to a square-wave alternating voltage and outputs the square-wave alternating voltage. The power supply device further includes a sine-wave adapter capable of converting the square-wave alternating voltage outputted from the inverter device to a sine-wave alternating voltage. The main body includes an inner body defining a space within the main body and an outer body constituting an outer shell. The power supply device further includes a grippable handle for carrying the main body. The main body further includes a holding section for holding the handle. The sine-wave adapter is capable of being accommodated in the upper chamber in a state where the sine-wave adapter is received on the middle cover. The inner body includes a concave section in confrontation with the sine-wave adapter and depressed outward from the main body. The holding section is fixed at the concave section.

It is preferable that the middle cover has a peripheral portion formed with at least one of U-shaped groove sections penetrating an upside of the middle cover and a downside thereof. The at least one of U-shaped groove sections are formed such that the peripheral portion of the middle cover is cut out.

It is preferable that the middle cover has a bottom surface formed with a through hole penetrating the upper chamber and the lower chamber.

It is preferable that the main body includes a buffer material for cushioning an impact.

It is preferable that the main body further includes an inner body defining a space within the main body. The battery is disposed within the inner body and the buffer material is disposed outside of the inner body.

It is preferable that the main body further includes an outer body constituting an outer shell of the main body. The buffer material is provided between the inner body and the outer body.

It is preferable that the main body includes an abutting section. The abutting section includes a first abutting section formed on a bottom surface of the inner body and a second abutting section formed at the outer body and in confrontation with the first abutting section.

It is preferable that the inner body has a bottom surface formed with a drainage hole penetrating inside of the main body and outside thereof. The bottom surface of the inner body includes a slant section slanted downward toward the drainage hole.

It is preferable that the slant section is slanted more than or equal to 1 degree relative to a horizon.

It is preferable that the abutting section is located at a position lower than the slant section, and the drainage hole is formed at the abutting section.

It is preferable that the buffer material has thermal insulation properties.

It is preferable that the power supply device further includes a plate-shaped battery plate provided at a bottom surface of the inner body and extending in a prescribed direction, a pair of battery shafts each having an upper end portion and a lower end portion, and a plate-shaped support plate extending in the prescribed direction and spanned above the battery. The battery plate is formed with a plurality of first holes spaced away from each other in the prescribed direction and is provided with restricting sections located at each end portions of the battery plate in a direction perpendicular to the prescribed direction. The lower end portion of each of the battery shafts extends through the corresponding first holes. The support plate is formed with a plurality of second holes spaced away from each other in the prescribed direction. The upper end portion of each of the battery shafts extends through the corresponding second holes. The battery is fixedly sandwiched by the support plate and the battery plate.

It is preferable that the power supply device further includes a first antislip member for preventing a slippage of the battery plate with respect to the battery plate.

It is preferable that the power supply device further includes a second antislip member for preventing a slippage of the battery with respect to the battery plate.

It is preferable that the first antislip member is a rubber damper.

It is preferable that the second antislip member is a rubber damper.

It is preferable that the battery includes a pair of terminals separating from each other at a predetermined distance. The support plate includes an insulating member having a length longer than the predetermined distance.

Advantageous Effects of Invention

According to the invention, a power supply device can be provided that can grasp temperature of the battery accurately.

BRIEF DESCRIPTION OF DRAWINGS

FIG. 5 is an external rear perspective view showing the power supply device when the inverter device is accommodated in the main body and the handle is positioned at the retracted position according to the embodiment of the present invention.

FIG. 6C is an explanatory view around a thermal protector of the power supply device according to the embodiment of the present invention.

FIG. 28A is a front view showing a handle according to a second modification of the embodiment of the present invention.

Figure 1:
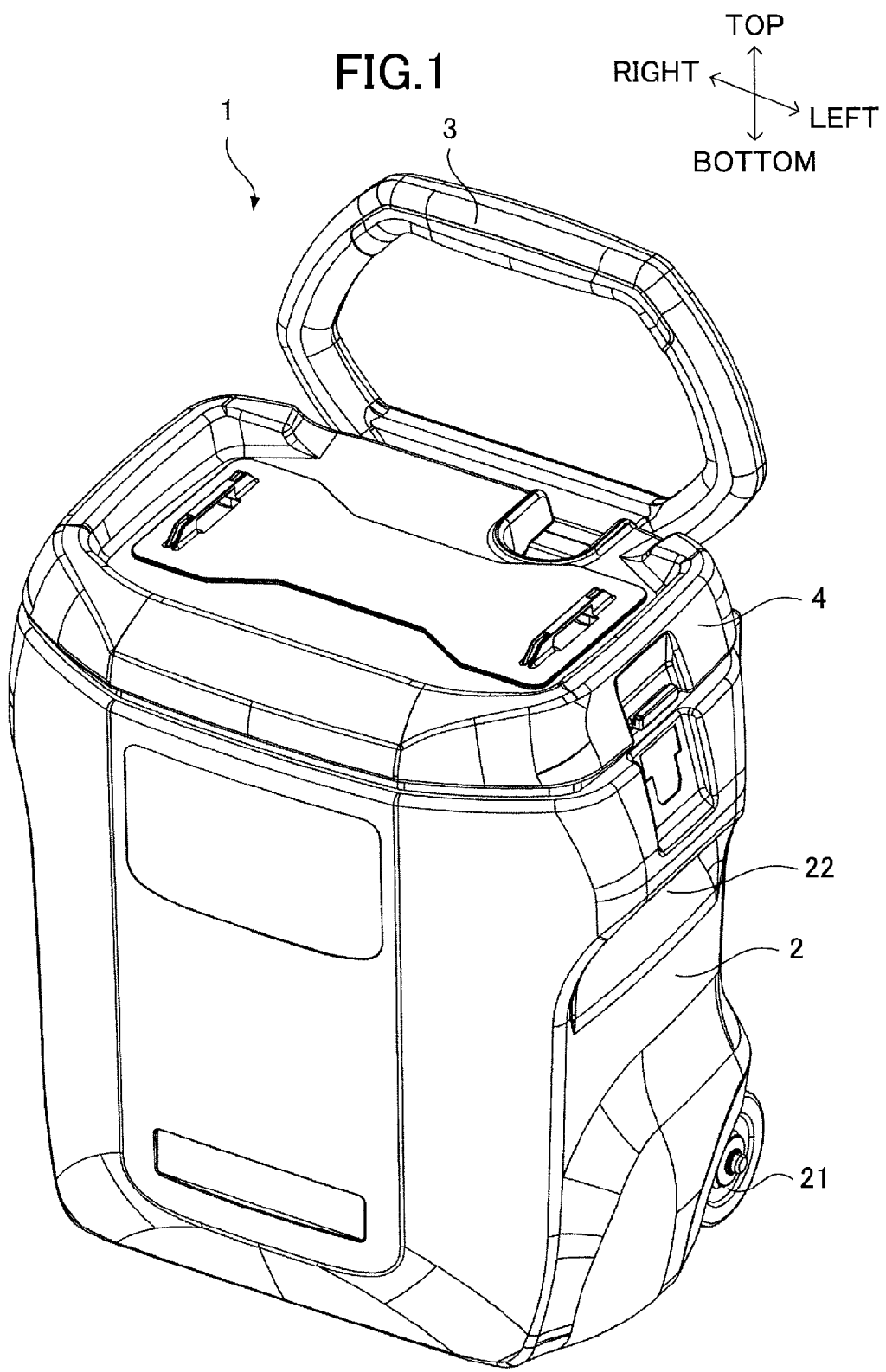
FIG. 1 is an external front perspective view showing a power supply device when an inverter device of the power supply device is accommodated in a main body according to an embodiment of the present invention.

REFERENCE SIGNS LIST 1 power supply device
2 main body
3 handle
4 upper cover
5 inverter device
6 middle cover
7 adapter
8 battery
9 sine-wave adapter
21 wheel
23 protrusion 24 outer body
25 inner body
25a recessed section
25b drainage hole
25D Slippage preventing members
25B slant section
26 upper chamber
27 lower chamber
28 lower chamber
31 holding section
37 first handle member
38 second handle member
31B abutting section
31C first damper
31D second damper
34A buffer material
43 latch plate
43A engaging section
44 wall section
47 groove section
47A peripheral section
47B curved section
48 first depressed section
49 second depressed section
52 output cable
61 surrounding wall
62 adapter accommodating section
63 middle-cover groove section
64 receiving section
81 terminal
82 battery plate
82B antislip member
83 battery shaft
85 support plate
87 elastic material

BEST MODE FOR CARRYING OUT THE INVENTION

The configuration of a power supply device 1 according to an embodiment of the invention will be described while referring to the accompanying drawings.

Figure 2:
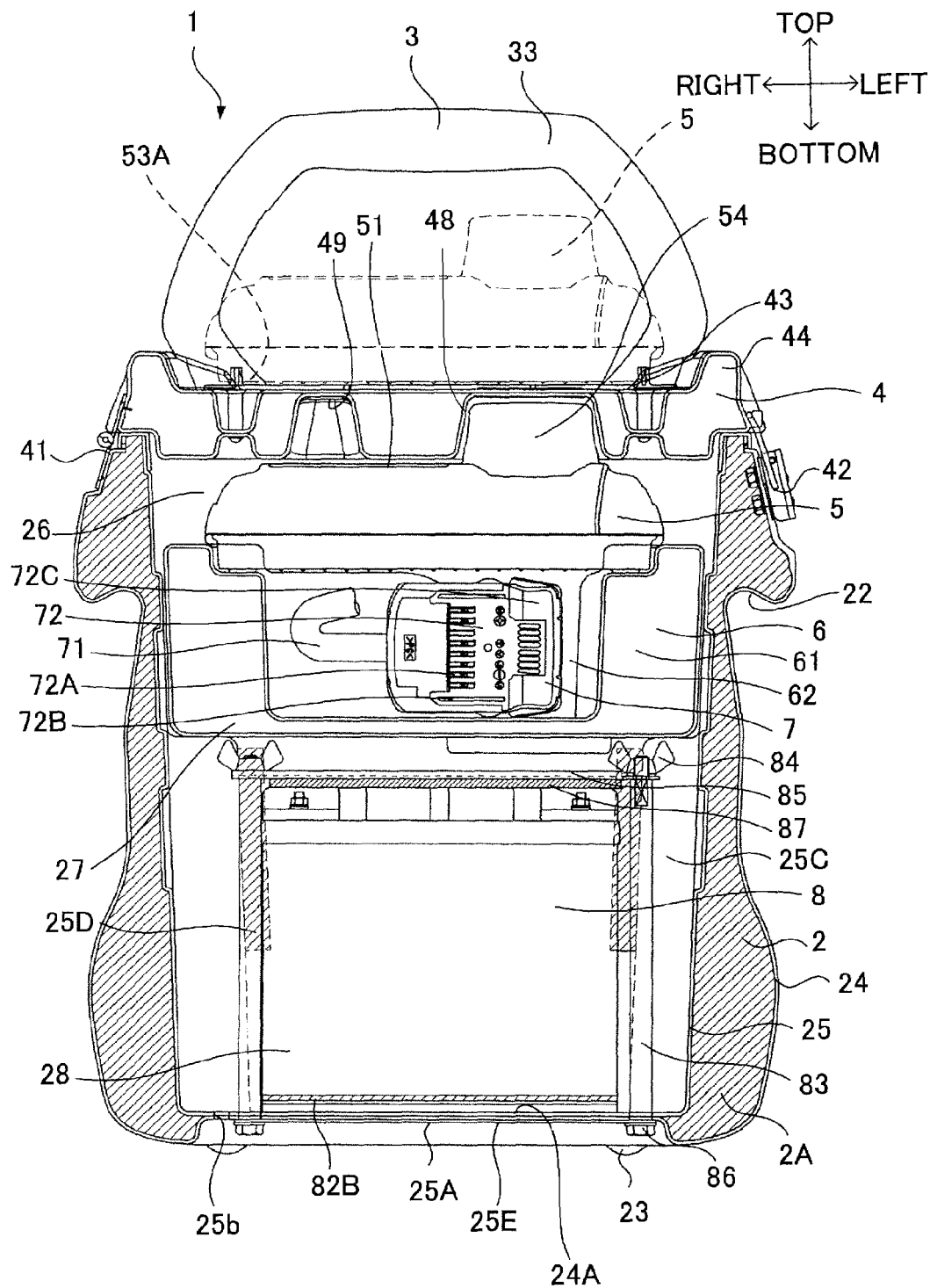
FIG. 2 is a front cross-sectional view showing the power supply device when the inverter device is accommodated in the main body according to the embodiment of the present invention.
Figure 3:
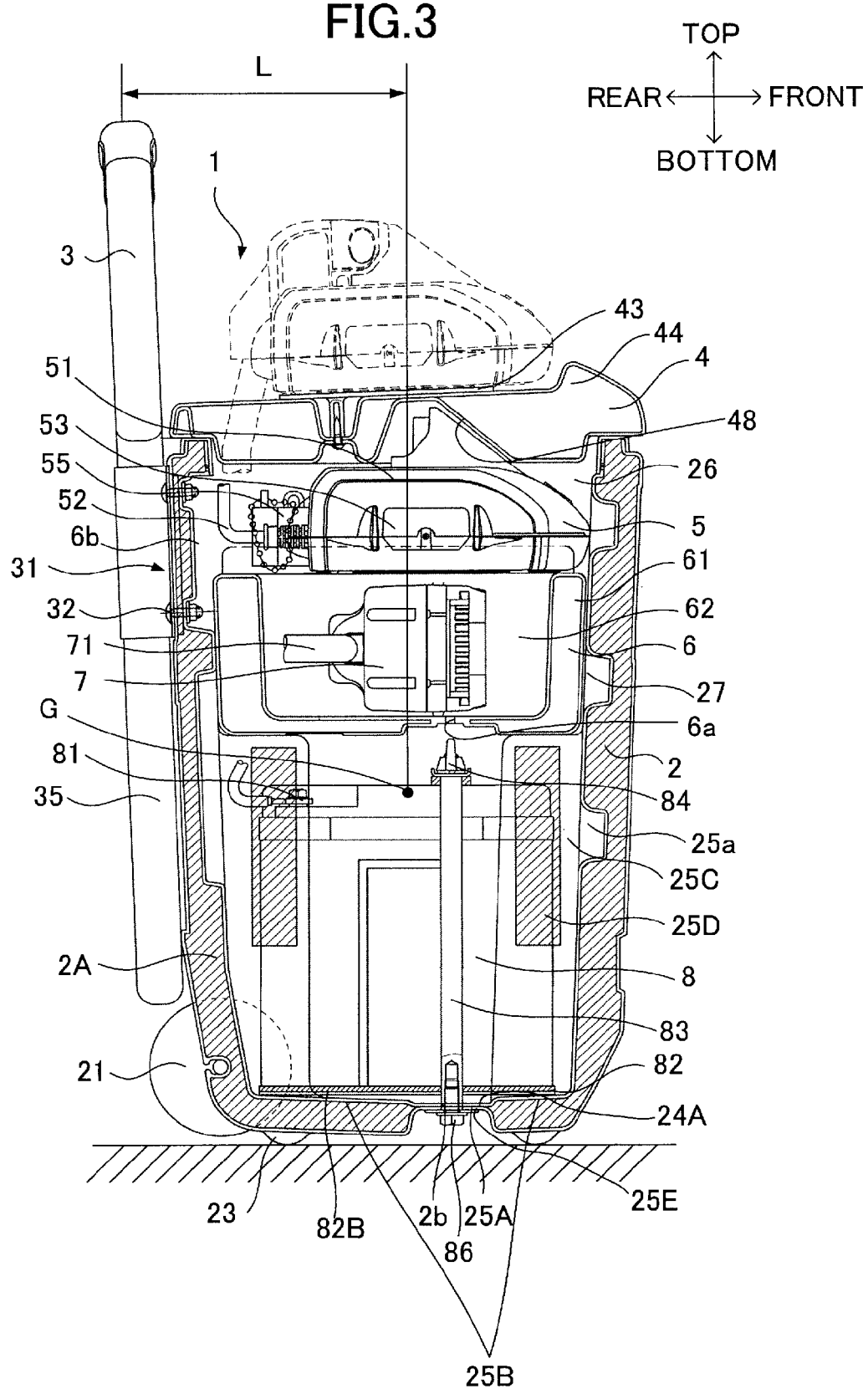
FIG. 3 is a side cross-sectional view showing the power supply device when the inverter device is accommodated in the main body according to the embodiment of the present invention.

As shown in FIGS. 1 and 2, the power supply device 1 mainly includes a main body 2, a handle 3, an upper cover 4, an inverter device 5, a middle cover 6, an adapter 7, and a battery 8. As shown in FIG. 2, a direction in which the handle 3 extends from the main body 2 is defined as an upper direction, and a direction opposite the upper direction is defined as a lower direction. Further, as shown in FIG. 3, a side of the handle 3 relative to the main body 2 is defined as a rear side, and a side opposite the rear side is defined as a front side. A direction perpendicular to the upper-lower direction and to the front-rear direction is defined as a left-right direction (FIG. 2).

Figure 13:
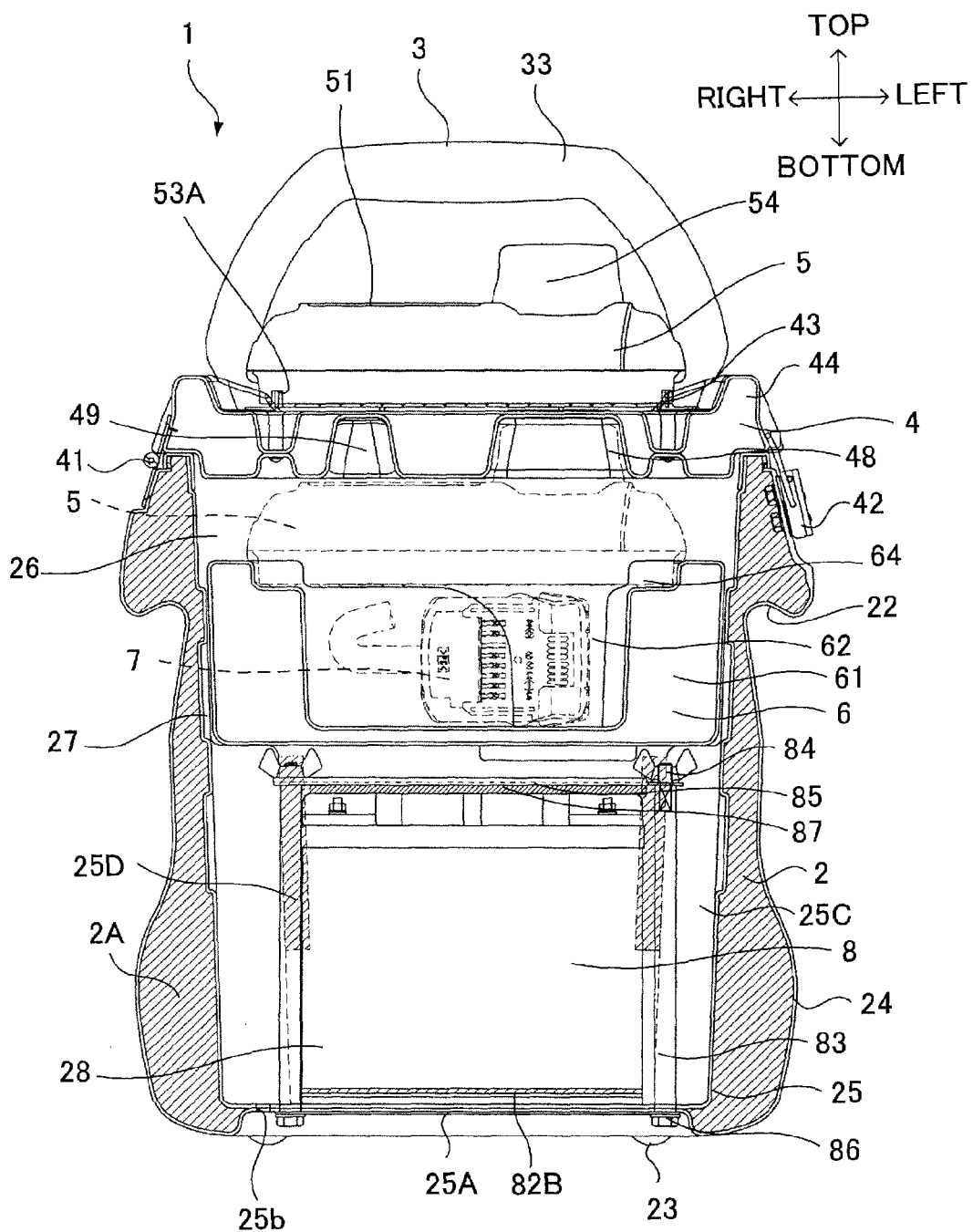
FIG. 13 is a front cross-sectional view showing the power supply device when the inverter device is fixed on the upper cover according to the embodiment of the present invention.
Figure 14:
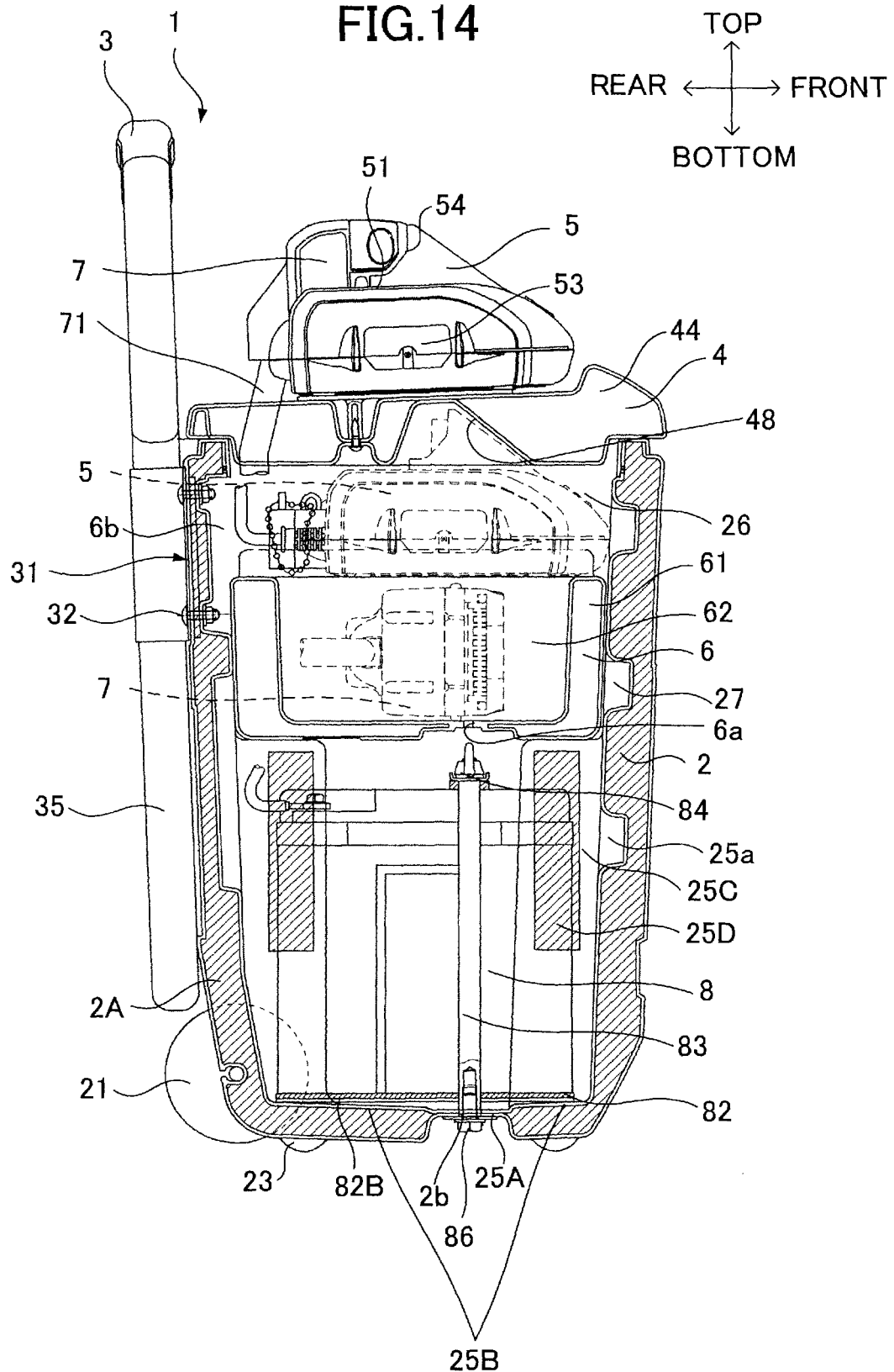
FIG. 14 is a side cross-sectional view showing the power supply device when the inverter device is fixed on the upper cover according to the embodiment of the present invention.
Figure 21:
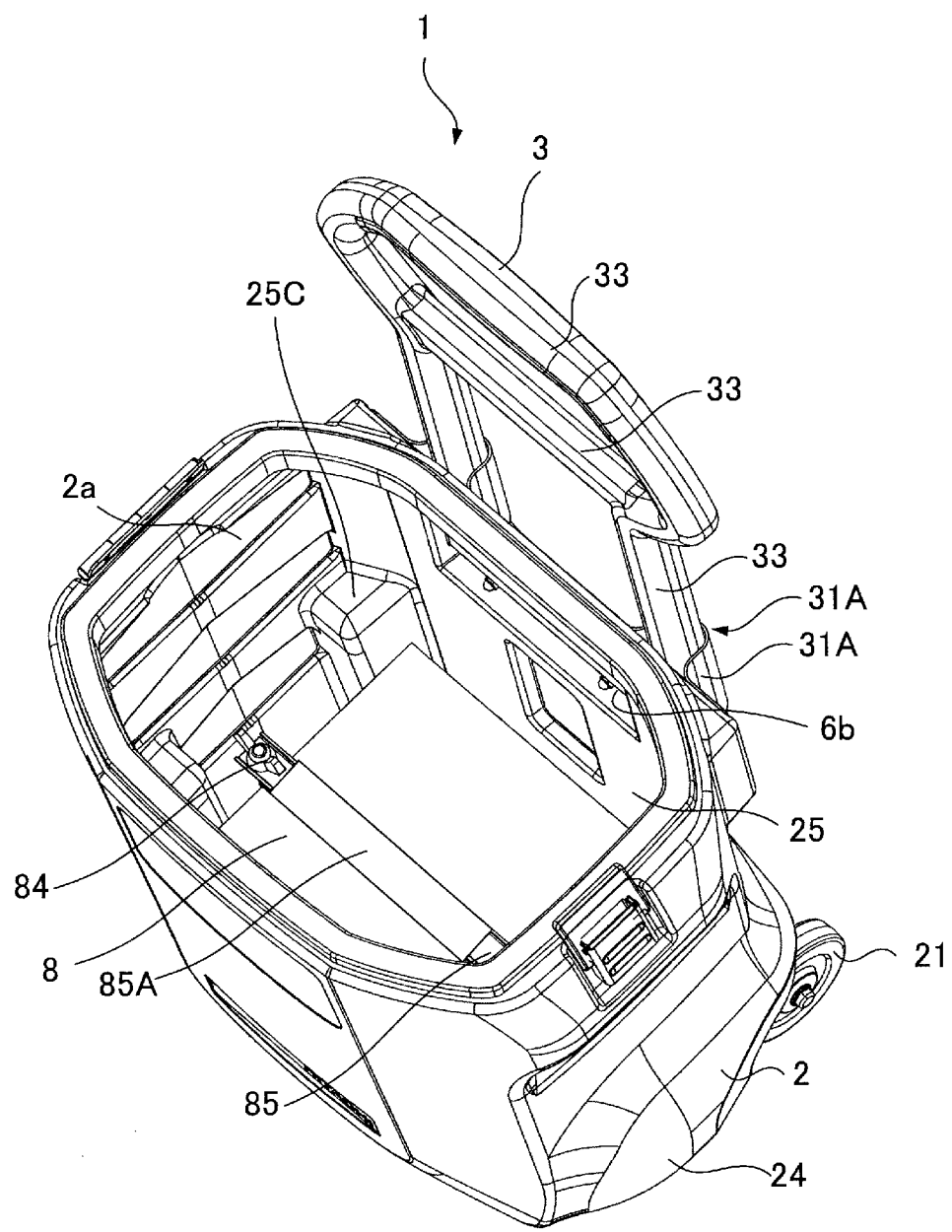
FIG. 21 is a perspective view showing the power supply device upon removing the upper cover and the middle cover according to the embodiment of the present invention.

As shown in FIG. 21, the main body 2 has an upper surface formed with an opening 2a, and the upper cover 4 can open and close the opening 2a. The main body 2 accommodates the inverter device 5, the middle cover 6, the adapter 7, and the battery 8. FIGS. 2 and 3 show, in the dotted lines, the inverter device 5 fitted with the adapter 7 above the upper cover 4, which indicates that the inverter device 5 can be fixed above the upper cover 4. Similarly, FIGS. 13 and 14 show the inverter device 5, in the dotted lines, above the middle cover 6, which indicates that the inverter device 5 can be placed on the middle cover 6. FIGS. 13 and 14 also show the adapter 7, in the dotted lines, inside the middle cover 6, which indicates that the adapter 7 can be accommodated on the middle cover 6. The main body 2 serves as a main body section of the invention, the upper cover 4 serves as a cover member of the invention, and the battery 8 serves as a battery of the invention.

Figure 4:
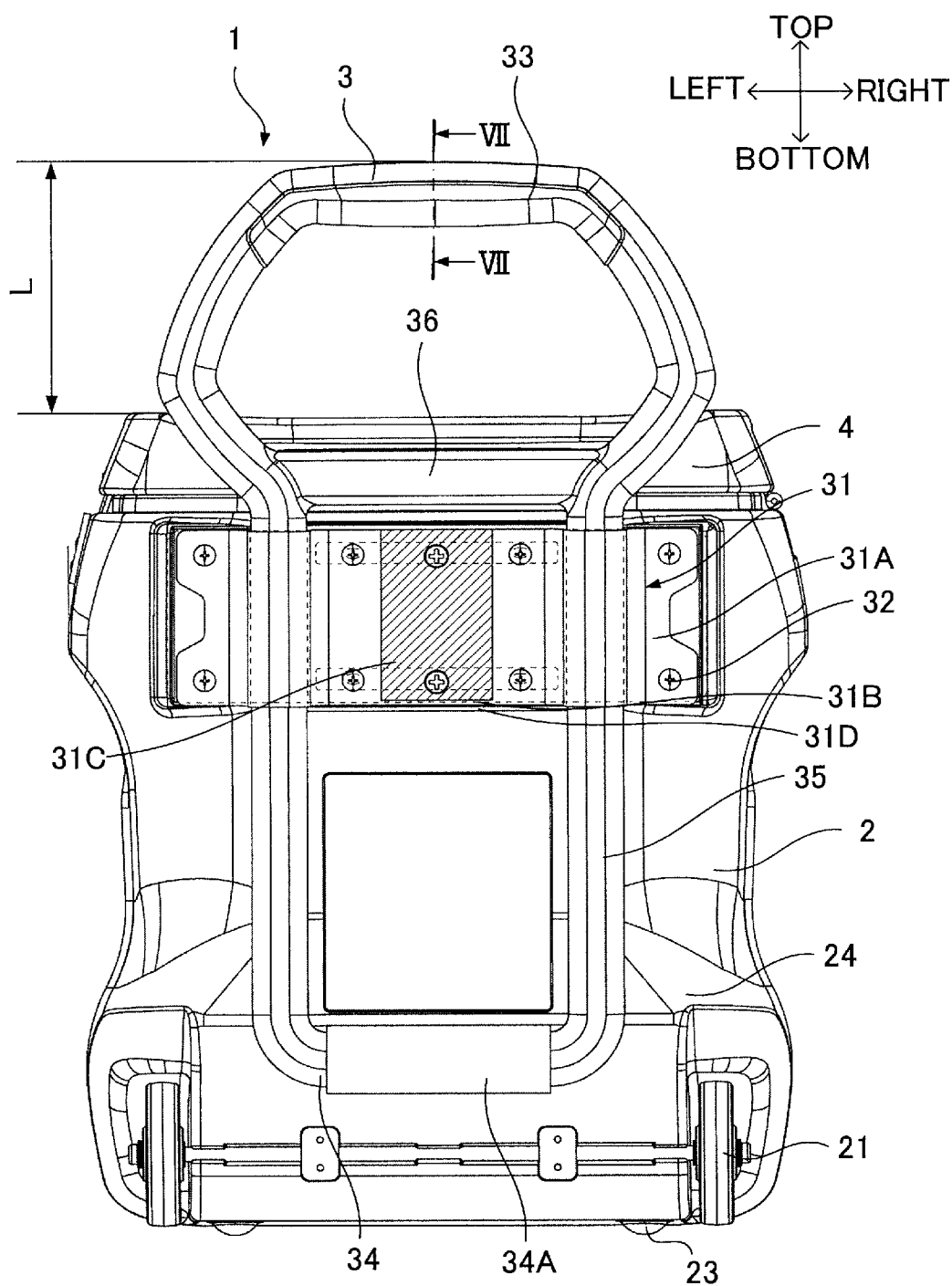
FIG. 4 is a rear view showing the power supply device when a handle is positioned at a retracted position according to the embodiment of the present invention.

As shown in FIGS. 4 and 5, two wheels 21 are provided at both ends of the lower rear surface of the main body 2 in the left-right direction. Grip sections 22 are symmetrically provided at left and right side surfaces of an upper part of the main body 2. The grip sections 22 are gripped by an operator when the operator lifts the power supply device 1. The detailed configurations of the main body 2 will be described later.

Figure 8:
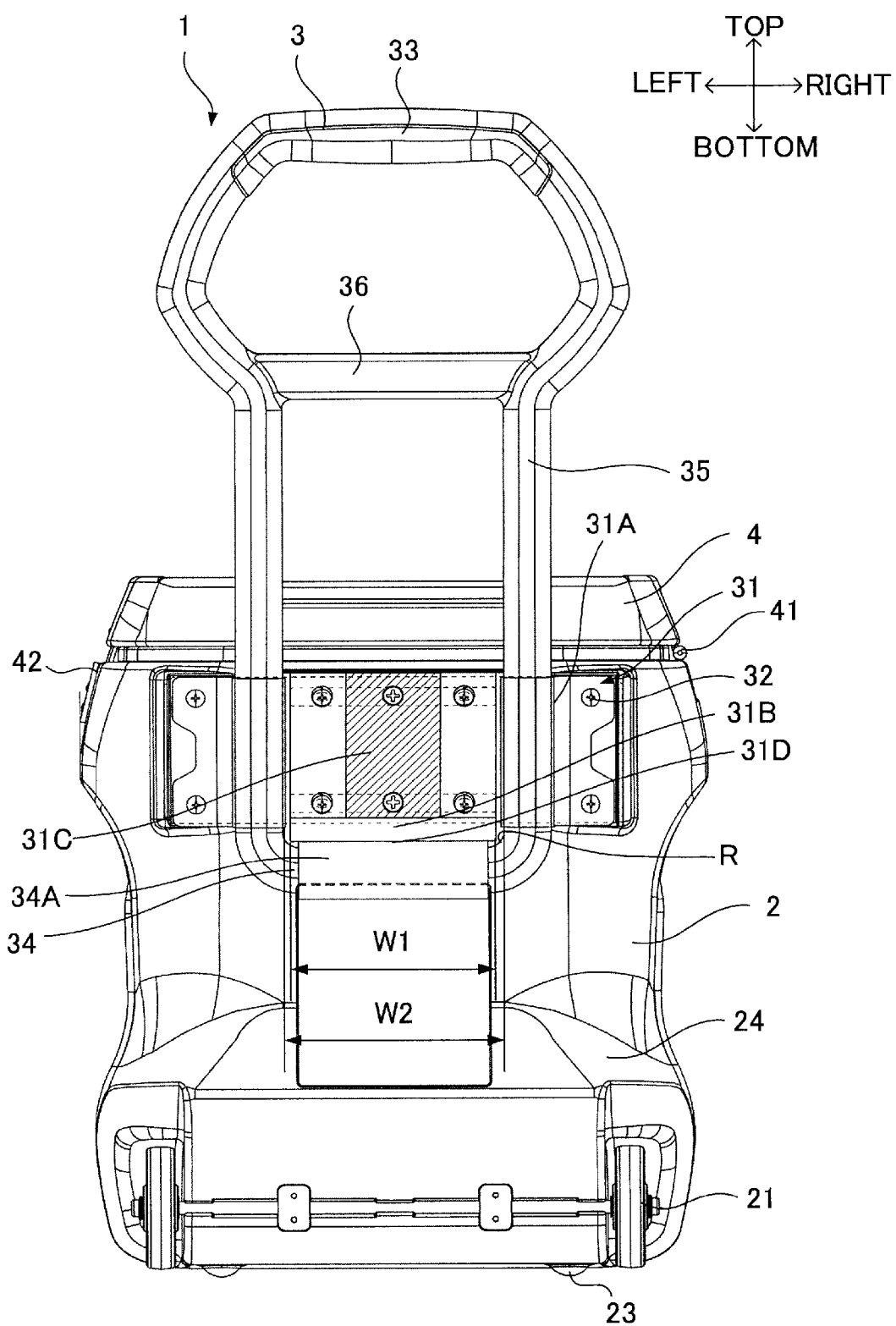
FIG. 8 is a rear view showing the power supply device when the handle is positioned at an extended position according to the embodiment of the present invention.

The handle 3 is provided at a rear surface of the main body 2, and is configured to be movable in the upper-lower direction between a retracted position shown in FIG. 4 and an extended position shown in FIG. 8. Both the handle 3 and the wheels 21 are provided at the rear surface of the main body 2. Thus, the operator can extend the handle 3 to the extended position and tilt the power supply device 1 to an oblique position, thereby carrying the power supply device 1 easily. The detailed configurations of the handle 3 will be described later.

As shown in FIG. 2, a hinge 41 is provided at the right end of the upper cover 4. The upper cover 4 is pivotally movable about the hinge 41 relative to the main body 2. The upper cover 4 is secured to the main body 2 with a latch 42 provided at the main body 2. The detailed configurations of the upper cover 4 will be described later.

The inverter device 5 converts a DC 12V input of the battery 8 into a square wave of AC 100V and outputs the square wave. The inverter device 5 can be used as a standalone power source, by detaching the inverter device 5 from the power supply device 1 and inserting a battery pack 5C (a battery pack for a power tool, 14.4V for example) indicated by the dotted lines in FIG. 24 in the inverter device 5. Note that the capacity of the battery pack 5C for a power tool (3.0 Ah) is smaller than the capacity of the battery 8 (38 Ah). The battery 8 is rechargeable via the inverter device 5 and the adapter 7, by mounting the adapter 7 on the inverter device 5, connecting one end of a power cable 56 described later with the inverter device 5, and connecting the other end of the power cable 56 with a commercial 100V power source. That is, the inverter device 5 also has a charging function. The detailed configurations of the inverter device 5 will be described later.

As shown in FIGS. 2 and 3, the middle cover 6 is arranged at approximately a center of the main body 2 in the upper-lower direction, and is configured to accommodate the adapter 7. The inverter device 5 can be placed on the upper surface of the middle cover 6. The detailed configurations of the middle cover 6 will be described later.

The adapter 7 includes an adapter cable 71 extending from the adapter 7, a connection section 72 connected with the inverter device 5. The adapter 7 is electrically connected with the battery 8 via the adapter cable 71. The power supply device 1 can be used as a 12V DC power source by connecting the adapter 7 with a power tool etc. (not shown). Note that, even though the battery 8 is 12V, the battery 8 can be used for a power tool of 14.4V or 10.8V, for example, by providing a step-up circuit or a step-down circuit in the adapter 7. Also, the power supply device 1 can be used as a 100V AC power source for a power tool etc. by mounting the adapter 7 on the inverter device 5 and taking an output from the inverter device 5. The connection section 72 includes a terminal section 72A, a rail section 72B, and a latch section 72C.

The battery 8 is disposed at a lower part of the main body 2, and serves as a power source of the power supply device 1.

Figure 6A:
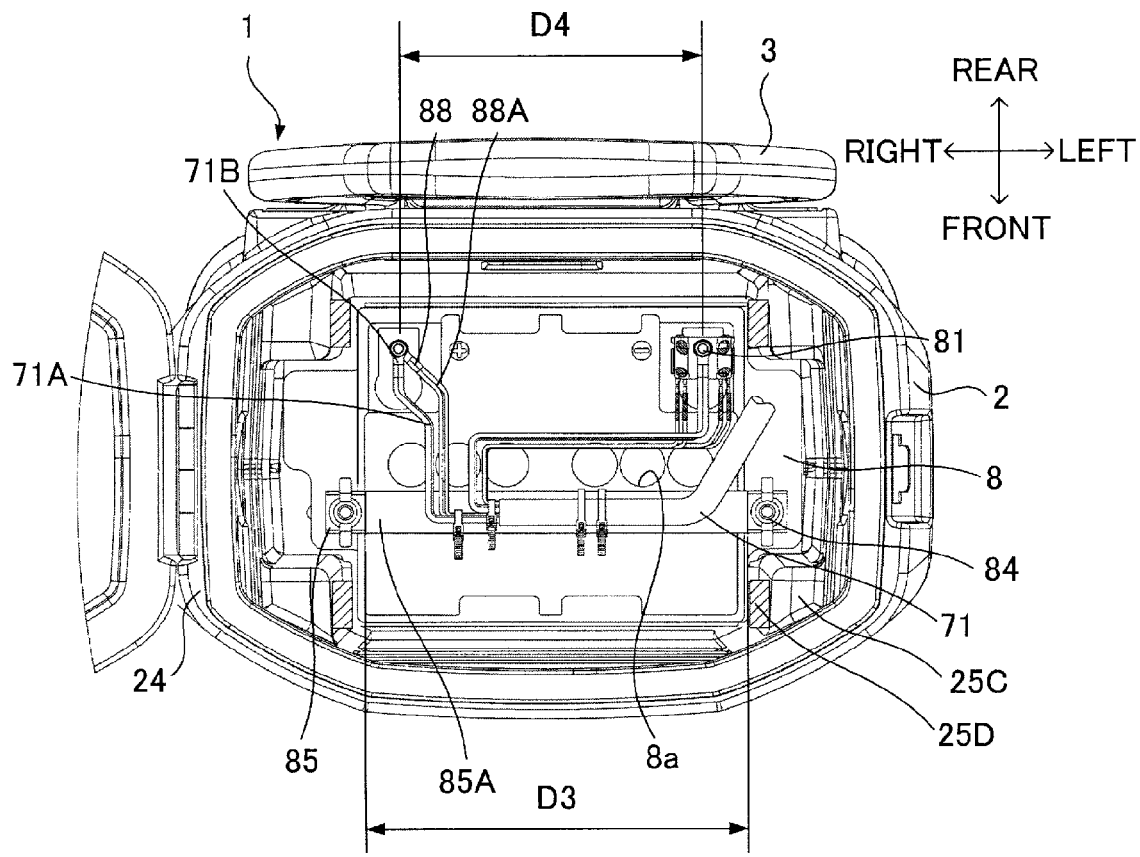
FIG. 6A is a plan view showing the power supply device upon opening an upper cover and removing a middle cover according to the embodiment of the present invention.

In the present embodiment, a lead battery for a vehicle use is adopted as an example of the battery 8. The battery 8 includes terminals 81 as shown in FIG. 6A, and is connected with the adapter 7 via the terminals 81 and the adapter cable 71. The detailed configurations of the battery 8 will be described later.

Four protrusions 23 are provided at the lower surface of the main body 2. As shown in FIG. 3, in a state where the power supply device 1 is placed on the ground, the four protrusions 23 are in contact with the ground, and the wheels 21 are spaced away from the ground. The main body 2 is constituted by a combination of an outer body 24 serving as the outer shell and an inner body 2 defining a space within the main body 2. The outer body 24 functions to absorb an impact when the power supply device 1 falls. A buffer material 2A is provided at the main body 2, and more specifically between the outer body 24 and the inner body 25. In the present embodiment, the buffer material 2A is filling material, and urethane is adopted as an example. Each of the outer body 24 and the inner body 25 is made of resin formed by blow molding. In the present embodiment, polyethylene is adopted as material of the inner body 25 and the outer body 24, considering a possibility that dilute sulfuric acid leaks out from the battery 8.

Because the buffer material 2A is filled between the outer body 24 and the inner body 25 as described above, the battery 8 does not tend to be affected by outer air temperature, and also the battery 8 etc. can be protected from impacts from the outside. Even if the temperature of the battery 8 rises, heat can be released to the outside through an upper-cover groove section 47 (FIG. 5), a middle-cover groove section 63 (FIG. 18), and the like, to be described later. This can suppress a temperature increase inside the main body 2. Similarly, even if hydrogen gas emanates from the battery 8, the hydrogen gas can be released to the outside through the groove sections. The upper cover-groove section 47 serves as a U-shaped groove of the invention. The middle-cover groove section 63 serves as a U-shaped groove section of the invention.

Note that the buffer material 2A may be provided at an area other than between the inner body 25 and the outer body 24. That is, the buffer material 2A may be provided between the inner body 25 and the battery 8 or may be provided at the inner body 25, as long as the battery 8 can be protected from an external force. Further, in the present embodiment, the inner body 25 and the outer body 24 are formed by blow molding. However, the inner body 25 and the outer body 24 may be formed by double layer molding, and elastomer as the buffer material 2A may be provided at the outer side of the inner body 25 or at the outer side of the outer body 24.

A hook (not shown) is detachably provided at the outer body 24 so as to temporarily hook the adapter 7 or the adapter cable 71. Further, a terminal accommodating section (not shown) is detachably provided at the outer body 24 so as to partially accommodate the connection section 72 of the adapter 7. This prevents the terminal section 72A of the adapter 7 from being exposed to the outside.

As shown in FIG. 4, a holding section 31 for holding the handle 3 is provided at a rear upper part of the outer body 24. The holding section 31 is fixed to the main body 2 with a plurality of bolts or screws 32. The holding section 31 has a bottom portion provided with a second damper 31D capable of contacting the handle 3. The second damper 31D serves as an elastic member of the invention.

An upper chamber 26, a middle chamber 27, and a lower chamber 28 are formed within the main body 2, in this order from the top. The inverter device 5 is arranged in the upper chamber 26. The middle cover 6 and the adapter 7 are arranged in the middle chamber 27. The battery 8 is arranged in the lower chamber 28.

As shown in FIG. 3, a plurality of recessed sections 25a is formed at the inner body 25. Each of the plurality of recessed sections 25a is depressed toward the outer body 24 opposing the inner body 25. This configuration ensures a large space within the main body 2, and increases rigidity of the inner body 25. Further, the amount of used buffer material 2A can be reduced, saving the manufacturing costs.

An abutting section 25A at which the outer body 24 and the inner body 25 contact each other is provided at the lower surface of the inner body 25. At the abutting section 25A, the outer body 24 is provided with an outer body side abutting section 25E depressed upward, and the inner body 25 is provided with an inner body side abutting section 24A protruding downward so as to contact the outer body side abutting section 25E. The abutting section 25A is a horizontal surface extending in the overall width of the lower surface of the inner body 25 in the left-right direction (FIG. 2) and extending in a predetermined length of the lower surface of the inner body 25 in the front-rear direction (FIG. 3). The abutting section 25A is provided at a position slightly offset forward from the center in the front-rear direction. The an outer body side abutting section 25E serves as a second abutting section of the invention, and the inner body side abutting section 24A serves as a first abutting section of the invention.

A drainage hole 25b penetrating through the outer body 24 and the inner body 25 is formed at the right end of the abutting section 25A (FIG. 2). As shown in FIG. 3, slant sections 25B are provided at the front and rear sides of the abutting section 25A. The slant sections 25B are slanted downward at least 1 degree toward the abutting section 25A. With this configuration, water dropped on the bottom surface of the main body 2 flows along the slant of the slant sections 25B, gathers at the abutting section 25A, and then is discharged to the outside through the drainage hole 25b.

As shown in FIG. 3, a battery plate 82 described later is disposed on the lower surface of the inner body 25. A though hole 2b penetrating the outer body 24 and the inner body 25 is formed at a lower part of the main body 2. A battery shaft 83 described later is inserted in the though hole 2b. The detailed configurations will be described later.

As shown in FIGS. 6A and 21, four ribs 25C protruding inward and holding the battery 8 are provided at the inner body 25. The ribs 25C extend in the upper-lower direction. The inner body 25 has generally rectangular cross-section and the ribs 25C are provided at four corners of the cross-section in the lower chamber 28. Slippage preventing members 25D are provided between the respective ribs 25C and the battery 8 for preventing the battery 8 from slipping (sliding) relative to the inner body 25. The slippage preventing members 25D also function as a buffer material between the battery 8 and the inner body 25. The middle cover 6 is placed on an upper surface of the four ribs 25C.

Figure 7:
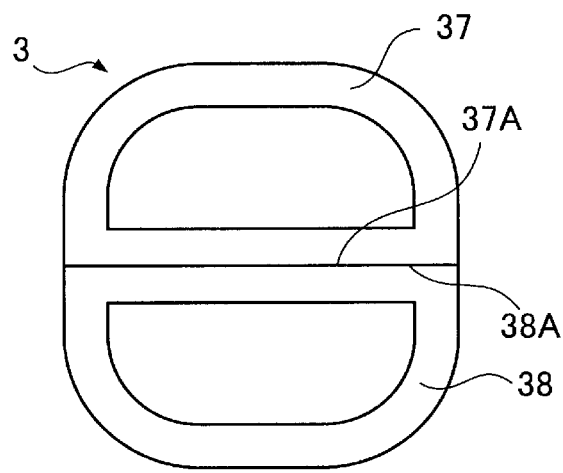
FIG. 7 is a cross-sectional view showing the handle taken along a line VII-VII of FIG. 4 according to the embodiment of the present invention.

As shown in FIG. 4, the handle 3 includes a handle gripping section 33, an abutment section 34, extending sections 35, and a reinforcing member 36. The handle gripping section 33 has substantially a U-shape for being gripped by an operator. The abutment section 34 contacts the holding section 31 when the handle 3 is positioned in the extended position. The extending sections 35 connect the handle gripping section 33 with the abutment section 34. The reinforcing member 36 extends in parallel with the abutment section 34. As shown in FIG. 7, the handle 3 includes a first handle member 37 having substantially a semicircular shape in cross-section, and a second handle member 38 having the same shape as the first handle member 37. More specifically, a first joint surface 37A is provided at a straight part of the semicircular shape of the first handle member 37, and a second joint surface 38A is provided at a straight part of the semicircular shape of the second handle member 38. The handle 3 is made by fixing the first joint surface 37A with the second joint surface 38A with a plurality of screws (not shown). In this way, the cross-section of the handle 3 has a half split shape that is plane-symmetrical with respect to the first joint surfaces 37A and the second joint surface 38A. This can improve the strength of the handle 3 with low-cost blow molding. However, the handle may have a hollow cylindrical shape unless it creates a problem in strength. Note that each of the first handle member 37 and the second handle member 38 has a hollow shape.

The abutment section 34 extends in a horizontal direction, and a buffer material 34A is provided over the entirety of the abutment section 34 in the circumferential direction (FIG. 4). In the retracted position, the front side (the main body 2 side) of the buffer material 34A is always in contact with the outer body 24. This prevents rattles of the handle 3.

Figure 9A:
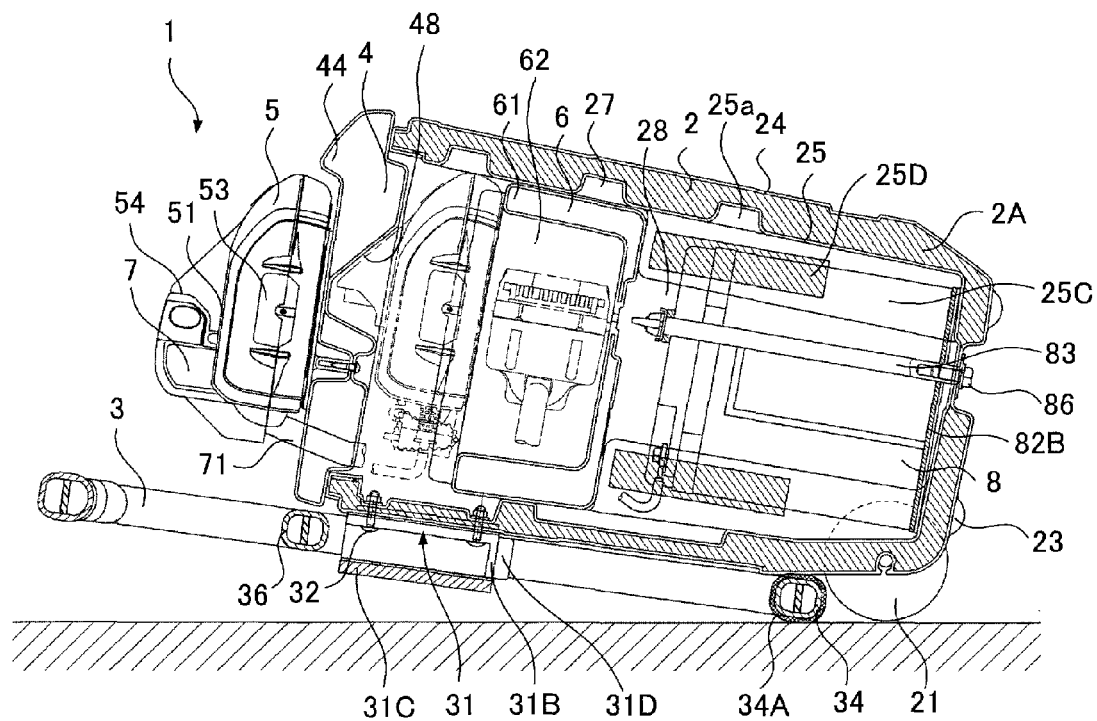
FIG. 9A is a side cross-sectional view showing the power supply device when the power supply device falls down toward the rear side according to the embodiment of the present invention.

In the present embodiment, rubber damper is adopted as an example of the buffer material 34A. The extending sections 35 extend in the vertical direction and are movably supported on the holding section 31 in the upper-lower direction. When the handle 3 is located at the extended position (FIG. 8), the buffer material 34A is in contact with the holding section 31. As shown in FIG. 9A, even when the power supply device 1 falls rearward, the buffer material 34A touches the ground first, and thus damages to other parts can be prevented. The reinforcing member 36 is a member for reinforcing the handle 3. The reinforcing member 36 is provided to close the opening of the substantially U-shaped handle gripping section 33. The buffer material 34A serves as an elastic member of the invention.

As shown in FIG. 5, the holding section 31 includes handle holding sections 31A that movably hold the handle 3, an abutting section 31B in parallel with the abutment section 34, and a first damper 31C. The handle holding sections 31A are pressed metal parts. Two handle holding sections 31A are provided so as to sandwich the first damper 31C in the left-right direction, and are fixed to the main body 2 with the bolts 32. The abutting section 31B is provided with the second damper 31D contactable with the buffer material 34A. The second damper 31D enables further cushioning for an impact generated upon contacting the abutment section 34 with the abutting section 31B. As shown in FIG. 8, a width W1 of the abutting section 31B and the second damper 31D in the left-right direction is smaller than a width W2 of the abutment section 34 in the left-right direction (more specifically, a distance between the extending sections 35). This can avoid a damage that occurs when connection sections R between the abutment section 34 and the extending sections 35 hit the abutting section 31B. The abutting section 31B also functions as a stopper that restricts movement of the handle 3. The second damper 31D serves as an elastic member of the invention. The abutting section 31B serves as a stopper of the invention.

Figure 9B:
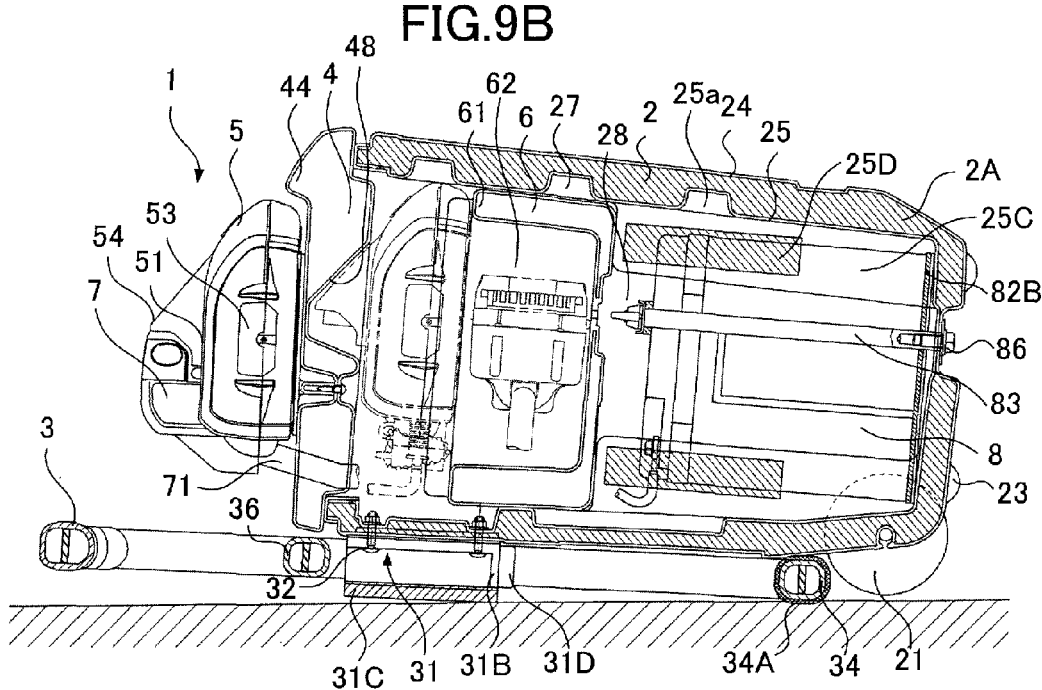
FIG. 9B is a side cross-sectional view showing the power supply device when the power supply device falls down toward the rear side according to the embodiment of the present invention.

As shown in FIG. 9B, the first damper 31C is provided at a position that is the farthest away from the main body 2 rearward. Even when the power supply device 1 falls rearward, the first damper 31C touches the ground next to the buffer material 34A to soften an impact acting on the main body 2. Hence, damages etc. to components can be prevented when the power supply device 1 falls.

Figure 10A:
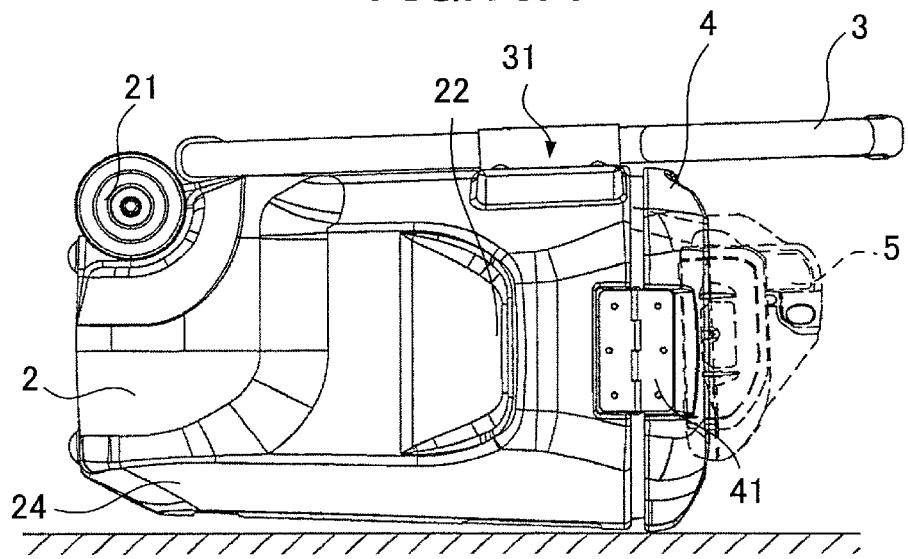
FIG. 10A is a side view showing the power supply device when the power supply device falls down toward the front side according to the embodiment of the present invention.
Figure 10B:
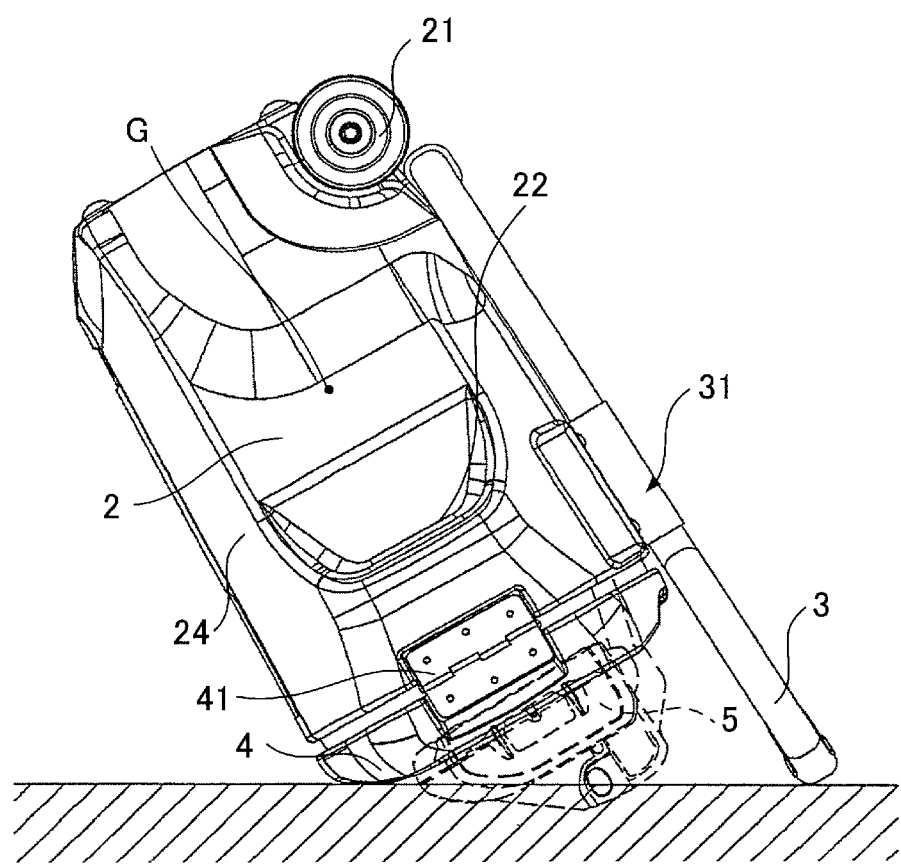
FIG. 10B is a side view showing the power supply device when the power supply device falls down according to the embodiment of the present invention.

When the handle 3 is positioned in the retracted position as shown in FIG. 3, the handle gripping section 33 protrudes further upward than the uppermost end of the upper cover 4 or the inverter device 5 (the dotted lines) fixed to the upper cover 4. A center of gravity G of the power supply device 1 is defined at a position as shown in FIG. 3. The center of gravity G and the handle gripping section 33 of the handle 3 is away from each other by a distance L. The distance L is determined so that the power supply device 1 in its 180 degrees reversed state (turned-over state) cannot be stably held. In the present embodiment, a lead battery for a vehicle use is adopted as an example of the battery 8, as mentioned above. Hence, depending on the condition of the battery 8, there is a possibility that dilute sulfuric acid of electrolyte leaks out. It is unlikely that dilute sulfuric acid leaks out of the battery 8 in a state where the power supply device 1 is fallen 90 degrees as shown in FIG. 10A. However, if the battery 8 is revered 180 degrees, there is a possibility that dilute sulfuric acid leaks out. In the present embodiment, the distance L is determined as described above. Thus, as shown in FIG. 10B, the handle 3 prohibits the power supply device 1 from maintaining the 180 degrees reversed state, which becomes the state shown in FIG. 10A. Furthermore, the center of gravity G shown FIG. 10B is defined such a position that the power supply device 1 in a state shown in FIG. 10B is bought into turn in a counter-clockwise direction, and then is rested on the ground as shown in FIG. 10A. Accordingly, even if the power supply device 1 falls forward fast, leaking of dilute sulfuric acid from the battery 8 can be prevented. The handle gripping section 33 serves as a farthest protruding section of the invention.

Figure 11:
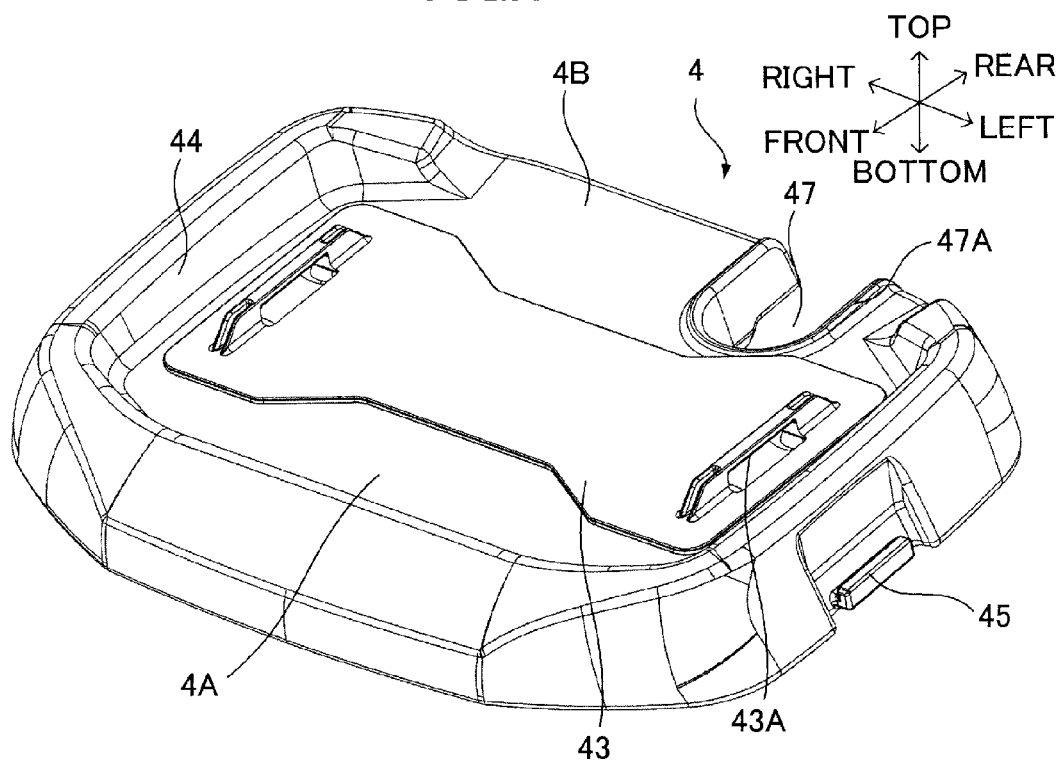
FIG. 11 is a plan perspective view showing the upper cover according to the embodiment of the present invention.
Figure 12:
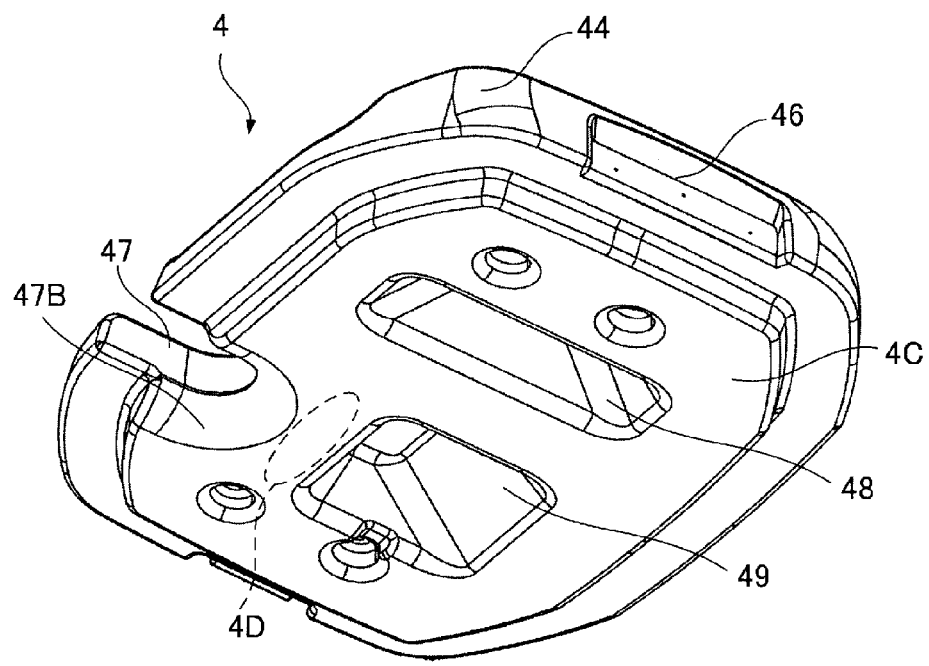
FIG. 12 is a bottom perspective view showing the upper cover according to the embodiment of the present invention.

The upper cover 4 has substantially a rectangular shape. As shown in FIGS. 11 and 12, the upper cover 4 includes a latch plate 43, a wall section 44 provided at the periphery of the upper cover 4, a latch engaging section 45 capable of engaging the latch 42, and a hinge mounting section 46 to which the hinge 41 is attached. The upper cover 4 has an upper surface 4A, a flat section 4B, and a lower surface 4C. The flat section 4B is provided at a periphery of the upper cover 4 where the wall section 44 is not provided. The upper cover 4 is formed with the upper-cover groove section 47, a first depressed section 48 formed in the lower surface 4C, and a second depressed section 49 adjacent to the first depressed section 48. The lower surface 4C has an abutment surface 4D in abutment with the adapter 7 in a state where the adapter 7 is mounted on the accommodating section 54 and the inverter device 5 is received on the receiving section 64. The upper-cover groove section 47 has substantially a U-shape in cross-section perpendicular to the upper-lower direction. As shown in FIGS. 2 and 3, the upper cover 4 has a hollow inside for saving weight. The latch plate 43 serves as an inverter-device fixing section of the invention. The wall section 44 serves as a protruding section of the invention.

As shown in FIGS. 13 and 14, the upper cover 4 can be fixed to the inverter device 5. As shown in FIG. 11, the latch plate 43 is provided with two engaging sections 43A each protruding upward and spaced away from each other in the left-right direction with a predetermined distance therebetween. The engaging sections 43A can engage engagement sections 53A (FIG. 2) of mount-dismount buttons 53 provided to the inverter device 5, thereby fixing the inverter device 5 to the upper cover 4.

Figure 15:
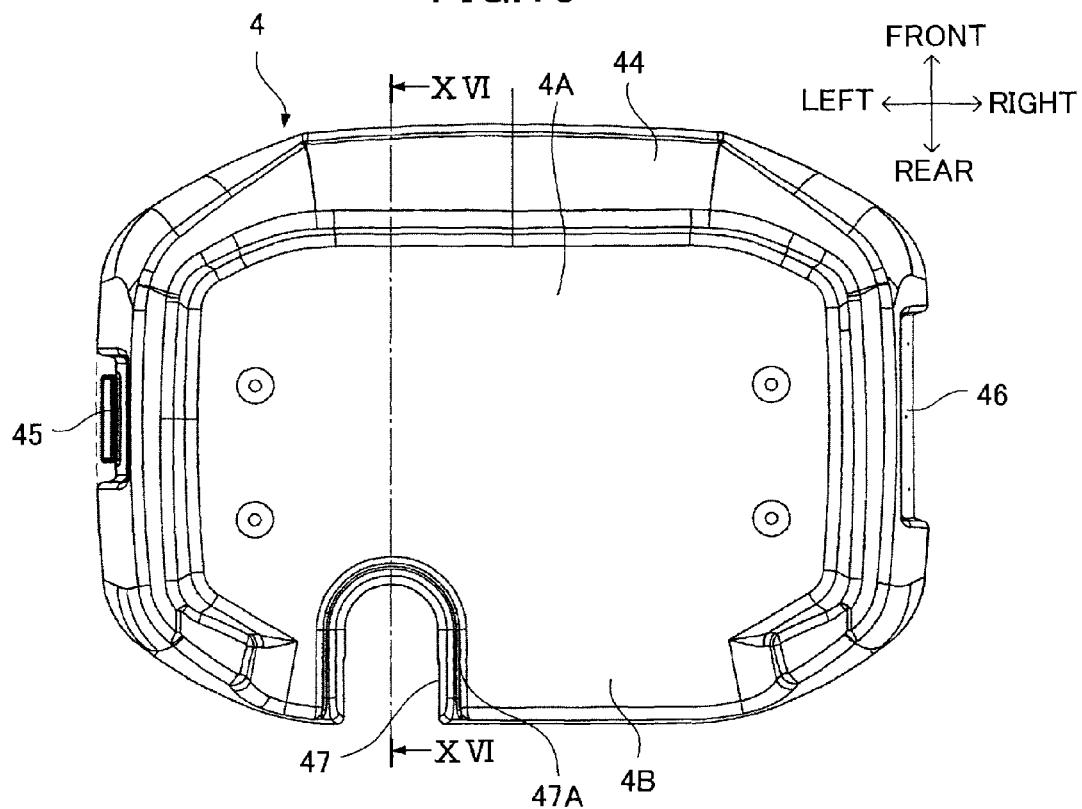
FIG. 15 is a plan view showing the upper cover according to the embodiment of the present invention.
Figure 16:
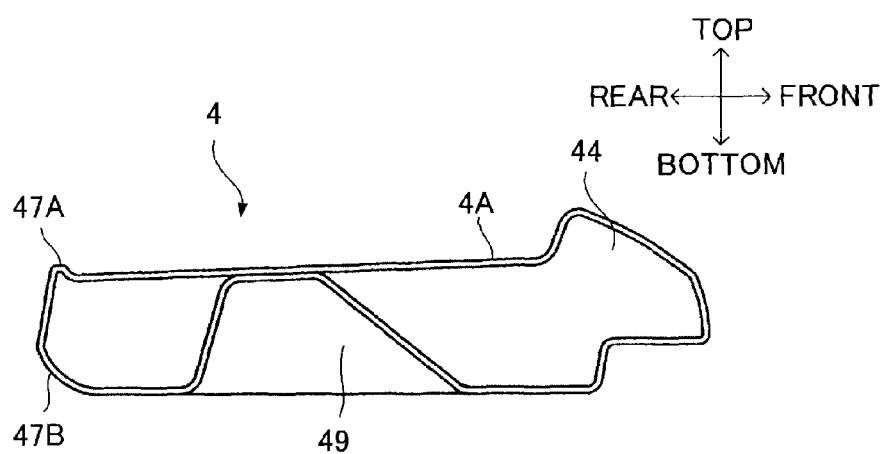
FIG. 16 is a cross-sectional view showing the upper cover taken along a line XVI-XVI of FIG. 15 according to the embodiment of the present invention.

The latch plate 43 is fixed to the upper cover 4 with a plurality of screws and, by removing the screws, the latch plate 43 can be detached from the upper cover 4. FIG. 15 shows a top view of the upper cover 4 in a state where the latch plate 43 is detached from the upper cover 4. FIG. 16 is a cross-sectional view taken along a line XVI-XVI in FIG. 15. The upper surface 4A and the flat section 4B of the upper cover 4 is slanted downward toward the rear at least 1 degree.

With this configuration, rain water is not collected around the engaging sections 43A, and rain water can be discharged through a portion of the upper cover 4 where the wall section 44 does not exist (the flat section 4B) as will be described later.

A peripheral section 47A is provided over the entire periphery of the upper-cover groove section 47. The peripheral section 47A is slightly higher than the upper surface 4A and the flat section 4B. As shown in FIG. 2, the lower surface 4C of the upper cover 4 is pressed against the inverter device 5 accommodated in the main body 2, in at least part other than portions where the first depressed section 48 and the second depressed section 49 are formed. With this configuration, the inverter device 5 is immovable within the main body 2. The peripheral section 47A serves as a protruding wall of the invention.

The wall section 44 is provided at the periphery of the upper cover 4, such that an opening of substantially a U-shape is located at the rear side (the handle side). As shown in FIG. 11, the flat section 4B is provided at the periphery at the rear side of the upper cover 4, where the wall section 44 is not provided between the wall section 44 and the peripheral section 47A. With this configuration, when the operator turns the power supply device 1 rearward for carrying the power supply device 1, water collected on the upper cover 4 is actively discharged to the outside from the upper cover 4 through the flat section 4B. Because the peripheral section 47A is provided at the periphery of the upper-cover groove section 47, intrusion of water into the main body 2 can be suppressed when the power supply device 1 is tuned rearward. As shown in FIGS. 5 and 11, the height of the wall section 44 is higher than the height of the engaging sections 43A. With this configuration, even if a plate-shaped member falls from above, the upper surface of the wall section 44 can receive the plate-shaped member, thereby preventing damages to the engaging sections 43A. As shown in FIG. 14, the height of the wall section 44 is lower than the height of the inverter device 5. This configuration enables the operator to visually check from the front side whether the inverter device 5 is mounted and a state of a display panel 51 of the inverter device 5, without being blocked by the wall section 44.

The latch engaging section 45 is provided at the left side surface of the upper cover 4 (FIG. 11). When the latch engaging section 45 engages the latch 42, the upper cover 4 is fixed to the main body 2. The hinge mounting section 46 is provided at the right side surface of the upper cover 4 (FIG. 12). The hinge 41 is attached to the hinge mounting section 46.

The upper-cover groove section 47 is formed at the rear surface of the upper cover 4. Cables of apparatuses accommodated within the main body 2 can be led to the outside through the upper-cover groove section 47. As shown in FIG. 11, the upper-cover groove section 47 is formed at the rear surface of the upper cover 4, and the adapter 7 is mounted on the rear side of the inverter device 5 (FIG. 14). Because the upper-cover groove section 47 is formed near a position at which the adapter 7 is mounted, cables or the like of the adapter 7 etc. can be readily taken to the outside of the main body 2. In addition, exposure of wiring of the adapter 7 can be minimized, and the wiring can be arranged together compactly. In a state where the inverter device 5 is fixed to the upper cover 4, the adapter cable 71 passes through the upper-cover groove section 47. Accordingly, the cross-sectional area of a cross-section of the upper-cover groove section 47 perpendicular to the upper-lower direction is sufficiently larger than the cross-sectional area of the adapter cable 71. As shown in FIGS. 12 and 16, a curved section 47B is provided at the lower side of the upper-cover groove section 47. The radius of curvature of the curved section 47B is larger than the radius of curvature of another section (for example, a connection portion between the upper surface 4A and the wall section 44). This configuration prevents the cable passing through the upper-cover groove section 47 from being caught on an edge of the upper-cover groove section 47.

As shown in FIGS. 2 and 3, the first depressed section 48 is depressed toward the inside of the upper cover 4 along the shape of an accommodating section 54 of the inverter device 5 protruding upward and described later. With this configuration, the first depressed section 48 can engage the accommodating section 54. If a comparison is made between the inverter device 5 indicated by the dotted lines in FIG. 14 and the inverter device 5 indicated by the solid lines, the adapter 7 is mounted on the inverter device 5 indicated by the solid lines and thus the adapter 7 protrudes to the rear side of the accommodating section 54. Even if the operator tries to place the inverter device 5 on the middle cover 6 and to close the upper cover 4 in a state where the adapter 7 is mounted on the inverter device 5, the lower surface 4C around the first depressed section 48 contacts the adapter 7 and the upper cover 4 cannot be closed.

The battery 8 is so configured that, in use, hydrogen gas is discharged through a gas venting holes $8a$ disposed at its center part (FIG. 6A). For the purpose of preventing the hydrogen gas from staying within the main body 2, in the present embodiment, the U-shaped upper-cover groove section 47 is formed at the rear surface of the upper cover 4 so that the hydrogen gas can be readily discharged to the outside. On the other hand, a control circuit of the adapter 7 is so configured that a fuse provided in the control circuit of the adapter 7 blows out if a terminal of the adapter 7 has a short circuit due to incorporation of a foreign matter or a failure of a mounted apparatus. The fuse sparks when the fuse blows out. Hence, there is a concern that the fuse sparks in the upper chamber 26 in a hermetically-closed state, if the power supply device 1 is used in a state where the inverter device 5 is disposed on the upper chamber 26, the inverter device 5 is connected with the adapter 7 and the upper cover 4 is closed, and the operator closes the upper-cover groove section 47. Thus, the power supply device 1 is so configured that the upper cover 4 cannot be closed if the inverter device 5 is disposed in the upper chamber 26 when the adapter 7 is connected therewith.

In the present embodiment, in order to prevent the inside of the main body 2 from being filled with hydrogen gas, the power supply device 1 is so configured that the upper cover 4 cannot be closed in a state where the inverter device 5 is disposed on the middle cover 6 and the adapter 7 or the battery pack 5C for a power tool is mounted on the inverter device 5. With this configuration, even if the power supply device 1 is used in a state where the upper-cover groove section 47 as a ventilating opening is closed, the inverter device 5 cannot be used in a state where the inverter device 5 is located in the upper chamber 26. Hence, a trouble caused by hydrogen gas can be avoided. Note that, when the fuse blows out, an electrical connection between the battery 8 and the inverter device 5 is cut off, and in this state hydrogen gas is not generated. Hydrogen gas is generated mainly during charging of the battery 8. Further, if the power supply device 1 is left while the adapter 7 is mounted on the inverter device 5, the power of the battery 8 is consumed by circuits of the inverter device 5 or the like. However, because the upper cover 4 cannot be closed in a state where the adapter 7 is mounted on the inverter device 5, unnecessary power consumption of the battery 8 can be suppressed.

The second depressed section 49 is formed at a position adjacent to the first depressed section 48. The second depressed section 49 is engageable with the accommodating section 54. The second depressed section 49 is provided for increasing the rigidity of the upper cover 4.

Figure 24:
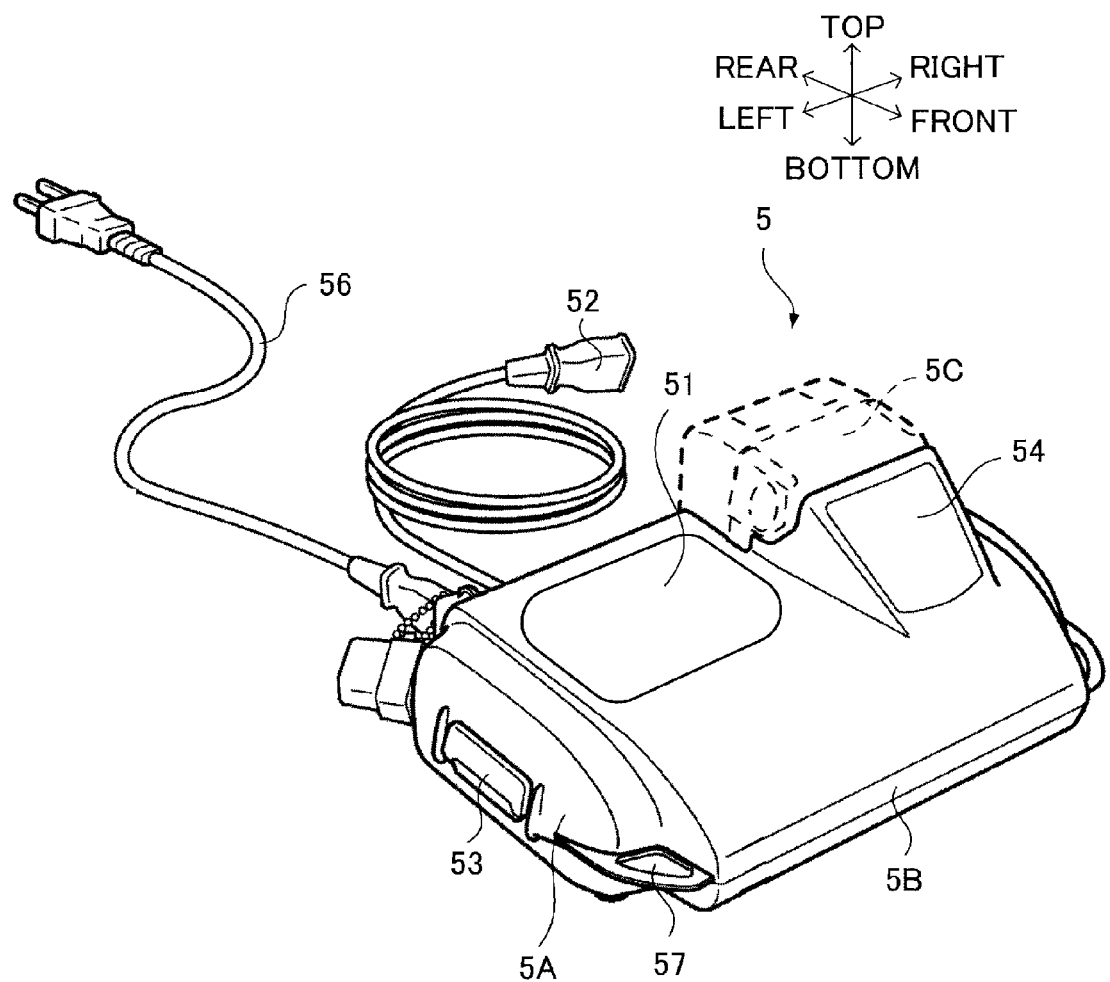
FIG. 24 is a perspective view showing the inverter device according to the embodiment of the present invention.

The inverter device 5 is accommodated in the main body 2 in a state where the inverter device 5 is interposed between the upper cover 4 and the middle cover 6. As shown in FIG. 24, the inverter device 5 includes the display panel 51 for displaying states of the inverter device 5, an output cable 52, the mount-dismount buttons 53, the accommodating section 54 that accommodates the adapter 7 or the battery pack 5C for a power tool indicated by the dotted lines, a power input section 55 that receives inputs from the outside (FIG. 3), the power cable 56 detachably connected with the power input section 55, and band hooking sections 57. The inverter device 5 has side protruding sections 5A protruding toward the sides and configured to be engageable with the middle cover 6, and a front protruding section 5B protruding forward and configured to be engageable with the middle cover 6. The connection section 72 of the adapter 7 for electrically connecting with the inverter device 5 has the same shape as the battery pack 5C for a power tool. With this configuration, it is unnecessary to provide the inverter device 5 with respective connection sections for the adapter 7 and for the battery pack 5C for a power tool, thereby preventing the inverter device 5 from becoming large.

The display panel 51 is provided with an LED lamp. The operator can determine, based on a state of lighting or blinking of the LED lamp, whether the battery is being used as a power source, the battery is being charged, or a malfunction has occurred at the power supply device 1. Either a DC voltage inputted from the battery 8 via the adapter 7 or a DC voltage inputted from the battery pack 5C for a power tool is outputted from the output cable 52 as a 100V AC voltage.

The mount-dismount buttons 53 are provided at the both ends of the inverter device 5 in the left-right direction. By pressing the mount-dismount buttons 53, the inverter device 5 can be mounted on or dismounted from the upper cover 4. The inverter device 5 is fixed to the upper cover 4 via an engagement between the engaging sections 43A of the latch plate 43 and engagement sections 53A of the mount-dismount buttons 53. The band hooking sections 57 are provided at the both ends of the front portion of the inverter device 5 in left-right direction, so that a shoulder band (not shown) can be hooked. With this configuration, the inverter device 5 can be used stand alone by taking the inverter device 5 out of the main body 2 and hooking the shoulder band at the band hooking sections 57. In this case, transportability can be improved by using the battery pack 5C for a power tool as the power source of the inverter device 5. Further, when the operator wishes to use the battery 8 via the adapter 7, by detaching the inverter device 5 from the upper cover 4 and carrying the inverter device 5 with the shoulder band, a power tool such as a driver drill etc. and the battery pack 5C for a power tool can be placed on the upper surface of the upper cover 4. Thus, usage can be broadened.

Figure 17:
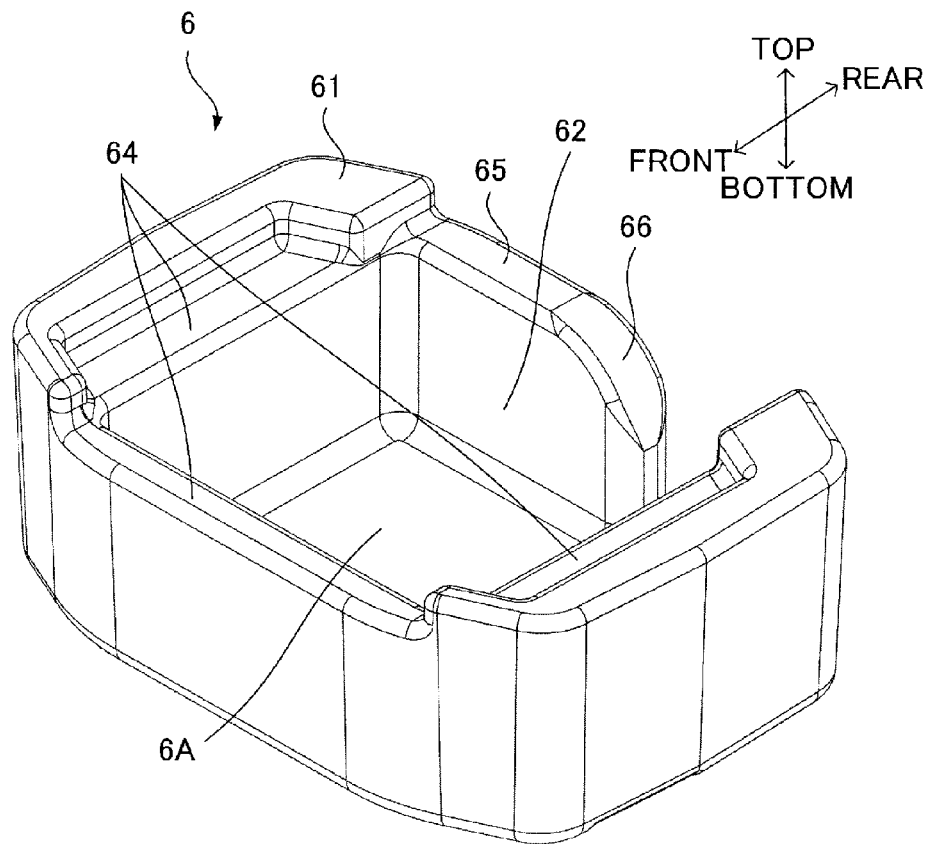
FIG. 17 is a perspective view showing the middle cover according to the embodiment of the present invention.
Figure 18:
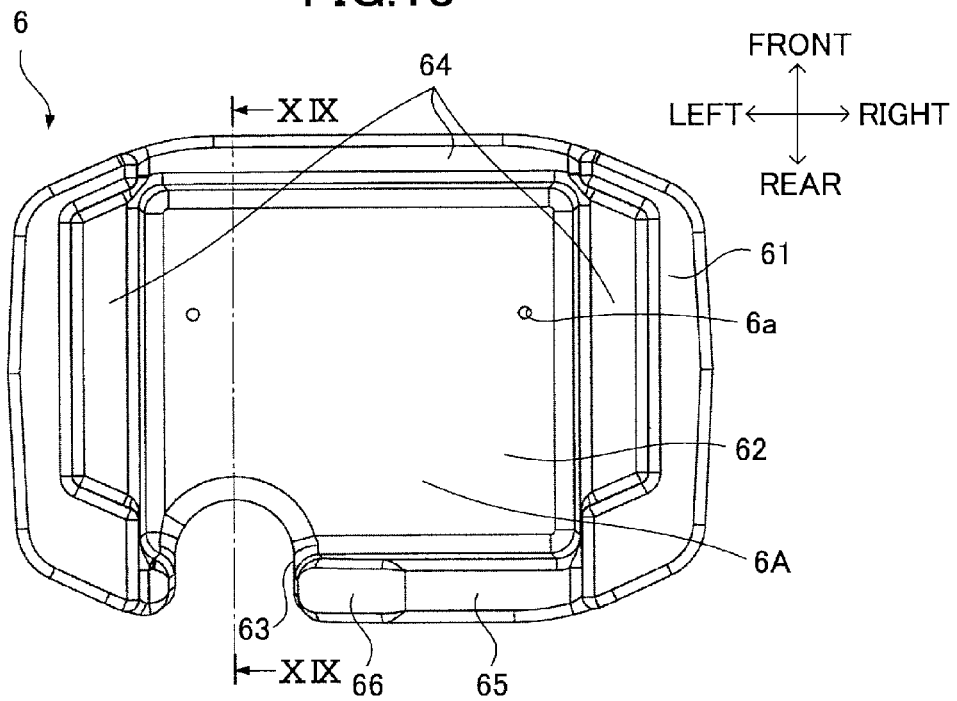
FIG. 18 is a plan view showing the middle cover according to the embodiment of the present invention.

The middle cover 6 is disposed in the middle chamber 27 and separates the upper chamber 26 from the lower chamber 28. As shown in FIG. 17, the middle cover 6 has a surrounding wall 61 by which a bottom surface 6A is defined. An adapter accommodating section 62 for accommodating the adapter 7 is formed at the center of the middle cover 6. The middle-cover groove section 63 is formed at the surrounding wall 61 at the rear side (FIG. 18). As shown in FIGS. 2 and 3, the middle cover 6 has a hollow inside for saving weight. The rigidity of the main body 2 is increased by filling the buffer material 2A between the outer body 24 and the inner body 25 for supporting the heavy battery 8 (15 kg). However, because the adapter 7 is light weight (1 kg), the adapter 7 can be supported although the middle cover 6 has a hollow inside. The adapter accommodating section 62 serves as an accommodating portion of the invention.

The bottom surface 6A is a horizontal surface. Two through holes 6a are formed in the bottom surface 6A to penetrate the bottom surface 6A in the upper-lower direction. The two through holes 6a are located adjacent to the surrounding wall 61 at the right and left sides, respectively, and away from each other by a predetermined distance. The upper chamber 26 and the lower chamber 28 are in communication with each other through the two through holes 6a and the middle-cover groove section 63. The two through holes 6a function as drainage holes for discharging water collected in the adapter accommodating section 62, and also functions as gas venting holes for removing hydrogen gas that emanates from the battery 8. This configuration can prevent water from being collected in the adapter accommodating section 62 and can prevent hydrogen gas emanating from the battery 8 from filling the lower chamber 28.

The upper surfaces of the surrounding wall 61 at the front, right, and left sides are depressed downward to form receiving sections 64. The inverter device 5 can be placed on the receiving sections 64. The side protruding sections 5A of the inverter device 5 are placed on the receiving sections 64 at the left and right sides, and the front protruding section 5B of the inverter device 5 is placed on the receiving section 64 at the front side. With this configuration, in a state where the inverter device 5 is placed on the middle cover 6, the inverter device 5 is immovable on the middle cover 6 in the front-rear direction and in the left-right direction. A cable receiving section 65 depressed downward is provided at the surrounding wall 61 at the rear side. The cable receiving section 65 is provided for supporting the output cable 52 etc. extending from the rear side of the inverter device 5 when the inverter device 5 is placed on the middle cover 6. That is, the cable receiving section 65 is provided at the surrounding wall 61 in the direction in which the respective cables extend, when the inverter device 5 is placed on the middle cover 6.

A first curved section 66 is provided at a connection between the cable receiving section 65 provided at the surrounding wall 61 at the rear side and the middle-cover groove section 63. The radius of curvature of a connecting portion between the bottom surface of the cable receiving section 65 and the side surface connecting the surrounding wall 61 at the rear side with the middle-cover groove section 63 is set to a large value, i.e., the first curved section 66 has a large radius of curvature. This configuration prevents the adapter cable 71 from being caught on the surrounding wall 61 when the adapter 7 is accommodated in the adapter accommodating section 62.

The adapter accommodating section 62 is provided substantially at a center portion of the middle cover 6 as viewed from the top (FIG. 18), and is located at a position lower than the receiving sections 64 (FIG. 17). The adapter accommodating section 62 has a volume enough to accommodate the adapter 7 and a portion of the adapter cable 71. With this configuration, the adapter 7 can be accommodated in the adapter accommodating section 62 in a state where the inverter device 5 is placed on the middle cover 6 (FIG. 2). Further, if the adapter 7 is not accommodated in the adapter accommodating section 62 since the adapter 7 is mounted on the inverter device 5 or the like, another apparatus with a size that can be accommodated in the adapter accommodating section 62, such as the battery pack 5C for a power tool, may be accommodated. With this configuration, an apparatus other than the power supply device 1 can be carried together with the power supply device 1, when the power supply device 1 is carried. Thus, transportability can be improved.

As shown in FIG. 18, the middle-cover groove section 63 has substantially a U-shape in a plan view. The adapter cable 71 accommodated in the adapter accommodating section 62 can be pulled out through the middle-cover groove section 63. As shown in FIG. 18, the middle-cover groove section 63 is formed on the surrounding wall 61 at the rear side. As shown in FIG. 3, the battery 8 is also disposed in the lower chamber 28 such that the terminals 81 are located at the rear side. Because the middle-cover groove section 63 is formed at the same side as the terminals 81 are disposed, the length of the adapter cable 71 can be minimized when the adapter 7 is accommodated in the adapter accommodating section 62.

Figure 19:
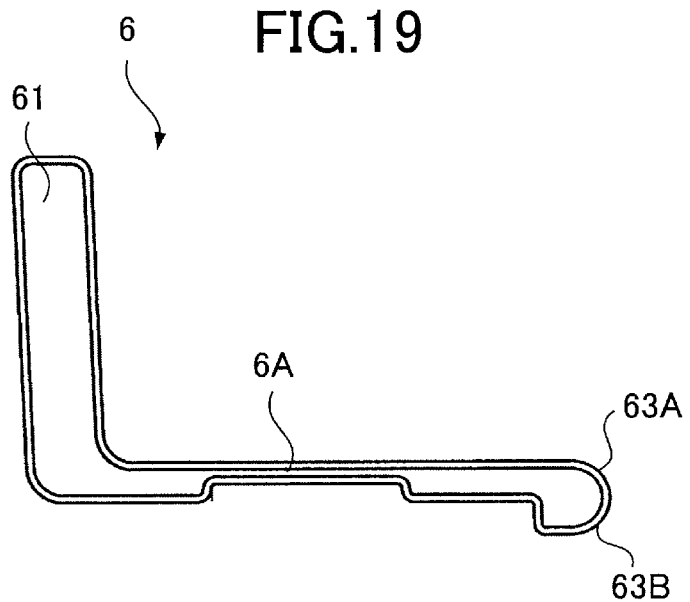
FIG. 19 is a cross-sectional view showing the middle cover taken along a line XIX-XIX of FIG. 18 according to the embodiment of the present invention.

As shown in FIG. 19, a second curved section 63A is provided at a connection between the bottom surface 6A and the middle-cover groove section 63, at the periphery of the middle-cover groove section 63. A third curved section 63B is provided directly below the second curved section 63A. The radii of curvature of the second curved section 63A and the third curved section 63B are identical, and are larger than the radii of curvature of other sections (for example, a connection between the surrounding wall 61 and the bottom surface 6A). The radii of curvature of the second curved section 63A and the third curved section 63B are larger than the radius of curvature of the curved section 47B. This is because the adapter cable 71 tends to be caught on the middle-cover groove section 63 since the middle cover 6 is located directly above the battery 8.

As shown in FIG. 3, the holding section 31 is located at the rear side of and slightly above the middle cover 6. At the holding section 31, the distance between the outer body 24 and the inner body 25 is small for reinforcing fixing of the handle holding sections 31A to the main body 2. With this configuration, a cable accommodating space 6*b* is defined by the inner body 25, the upper cover 4, the inverter device 5, and the middle cover 6. More specifically, the cable accommodating space 6*b* is defined at a position opposing the inverter device 5 in a state where the inverter device 5 is placed on the middle cover 6. The cable accommodating space 6*b* accommodates the output cable 52 extending from the rear surface of the inverter device 5 when the inverter device 5 is placed on the middle cover 6 and accommodates the adapter cable 71. With this configuration, it is unnecessary to make the outer body 24 etc. protrude in order to form a space for accommodating the cables. Hence, an increase in the size of the power supply device 1 can be suppressed. The cable accommodating space 6*b* serves as a concave section of the invention.

Figure 20:
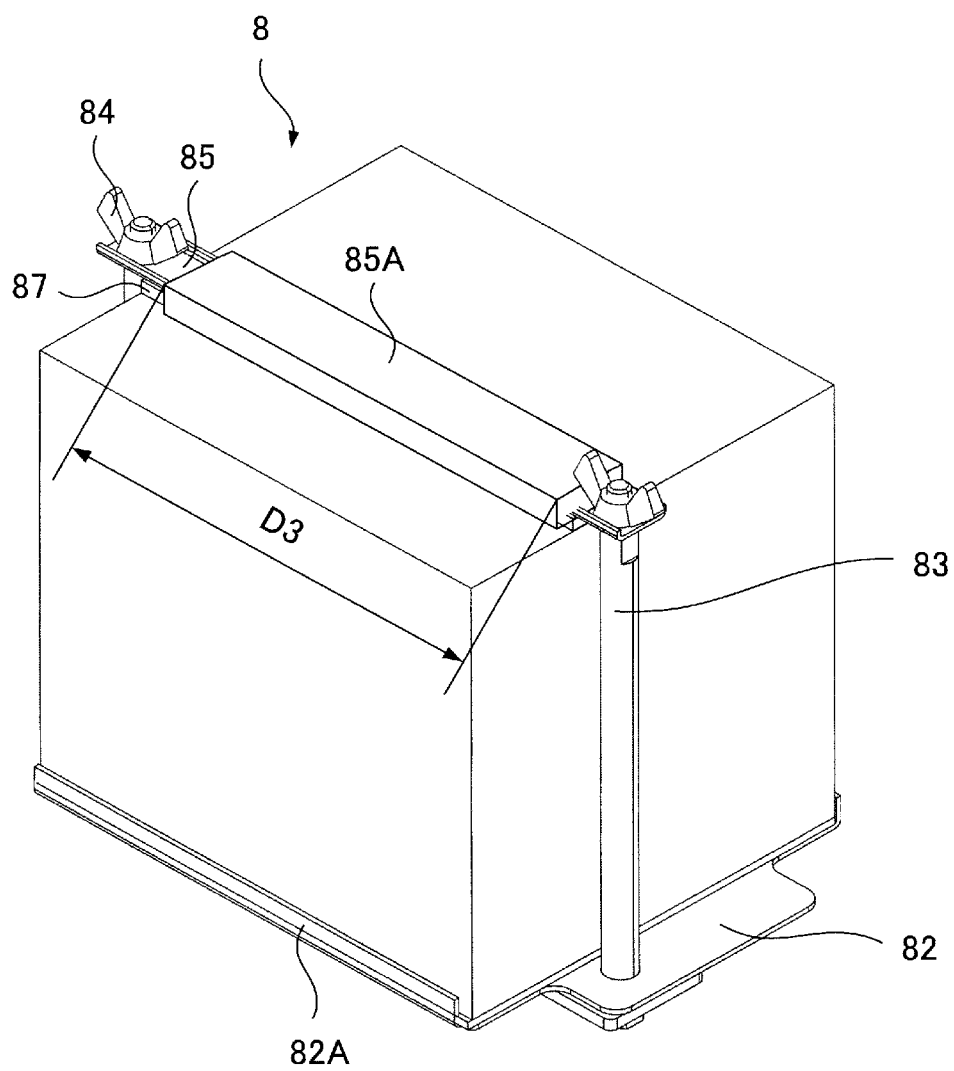
FIG. 20 is a perspective view showing the battery according to the embodiment of the present invention.
Figure 22:
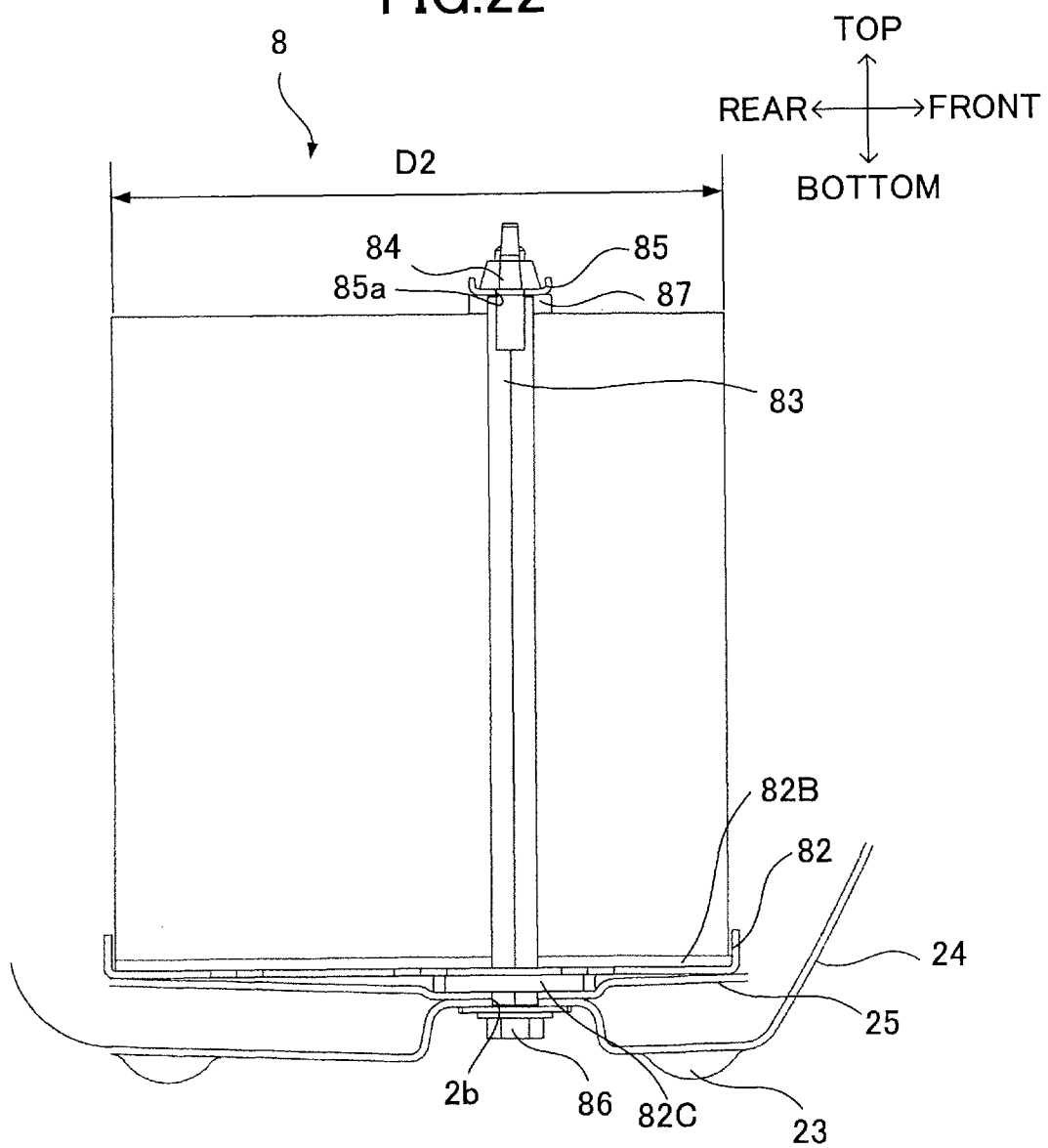
FIG. 22 is a partial enlarged side cross-sectional view showing the power supply device according to the embodiment of the present invention.
Figure 23:
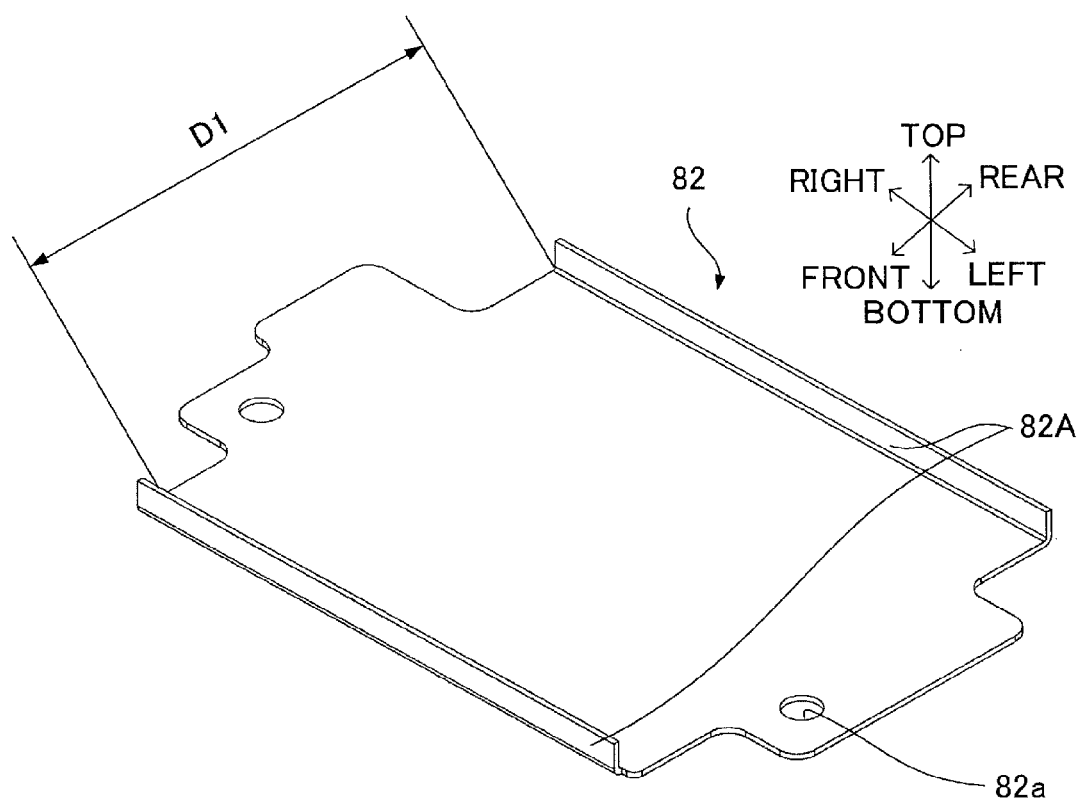
FIG. 23 is a perspective view showing a battery plate according to the embodiment of the present invention.

As shown in FIGS. 20 through 22, the battery 8 is fixed to the main body 2 via the battery plate 82, the battery shafts 83, a support plate 85, and bolts 86. The battery plate 82 is placed on the main body 2 and has substantially a plate shape. The battery shafts 83 extend upward from the both ends of the battery plate 82 in the left-right direction. The support plate 85 is fixed to the one end of each of the battery shafts 83 with wing bolts 84. Each bolt 86 is threadingly mounted on the other end of the battery shaft 83. A first antislip member 82B is provided between the battery plate 82 and the battery 8 (FIG. 22). A second antislip member 82C is provided between the inner body 25 and the battery plate 82. In the present embodiment, a rubber damper is adopted as an example of the first and second antislip members 82B, 82C. The battery plate 82 is made of metal. As shown in FIG. 23, the battery plate 82 includes two restricting sections 82A formed by bending upward the both ends in the front-rear direction. A distance D1 between the two restricting sections 82A is slightly larger than a distance D2 of the battery 8 in the front-rear direction (FIG. 22). With this configuration, movement of the battery 8 in the front-rear direction is restricted. Shaft through holes 82*a* into which the battery shafts 83 inserted are formed in the battery plate 82 at positions shifted slightly forward from the center in the front-rear direction. The two shaft through holes 82*a* are formed with a predetermined distance therebetween in the left-right direction. Each battery shaft 83 penetrates the shaft through hole 82*a* and the though hole 2*b* formed in the main body 2 and is fixed to the main body 2 with the bolt 86. The battery 8 can be readily positioned with the restricting sections 82A of the battery plate 82 and the battery shafts 83, when the battery 8 is placed on the battery plate 82. The restricting sections 82A serve as a positioning protrusion of the present invention. The shaft through holes 82*a* serve as first holes of the invention.

As shown in FIG. 3, the battery 8 is supported by the battery shafts 83 in the lower chamber 28 at a position shifted slightly forward from the center in the front-rear direction. When the outer body 24 and the inner body 25 are made with blow molding, recessed portions need to be formed for accommodating the wheels 21. However, there is a problem that, if the recessed portions and the abutting section 25A are close to each other, that shape cannot be held in blow molding. On the other hand, there is a problem that, if the gas venting holes 8*a* for discharging hydrogen gas is disposed at a center portion of the battery 8 and if the battery plate 82 is disposed at the center portion of the battery 8, the battery plate 82 closes the gas venting holes 8*a*. In order to avoid these problems, the size of the main body 2 could be simply increased. In the present embodiment, however, the battery 8 is supported by the battery shafts 83 at a position shifted forward slightly from the center in the front-rear direction, so that the distance between the recessed portions accommodating the wheels 21 and the abutting section 25A is sufficiently large. This achieves downsizing of the main body 2 and cost reduction.

As shown in FIG. 2, the battery 8 is fixed to the main body 2 in the lower chamber 28 at a position slightly shifted leftward from the center in the left-right direction. Because the upper cover 4 pivotally moves about the hinge 41, the center of gravity of the power supply device 1 shifts rightward when the upper cover 4 is opened. The battery 8 is fixed at the position slightly shifted leftward from the center of the main body 2, so that the center of gravity of the power supply device 1 is kept at a position close to the center in the left-right direction even when the upper cover 4 is opened. With this configuration, because a space is formed at the right side of the battery 8, the drainage hole 25*b* is formed in the abutting section 25A at a position facing the space.

As shown in FIG. 2, the battery 8 is restricted from moving in the left-right direction by the battery shafts 83 extending upward from the both ends in the left-right direction. As shown in FIG. 22, an elastic material 87 is provided between the support plate 85 and the upper surface of the battery 8 for protecting the same and for preventing slippage of the battery 8. The support plate 85 has width ends portion each formed with through holes 85*a* through which the battery shaft 83 extends. The support plate 85 and the elastic material 87 are pressed against the battery 8 by the wing bolts 84, thereby restricting movement of the battery 8 in the upper-lower direction. With this configuration, the battery 8 is completely fixed to the main body 2. The support plate 85 is provided with an insulating member 85A over a distance D3 in the widthwise direction (FIG. 20). As shown in FIG. 6A, the distance D3 is larger than a distance D4 between the terminals 81. This configuration suppresses a situation in which the support plate 85 contacts the terminals of the battery 8 and a short circuit occurs when the battery 8 is replaced. The through hole 85a serves as a second hole of the invention.

Figure 6B:
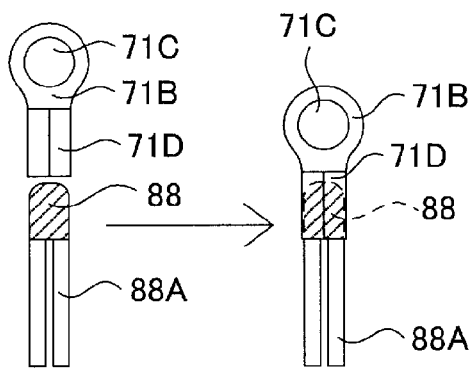
FIG. 6B is an explanatory view showing a thermistor of the power supply device according to the embodiment of the present invention.

As shown in FIGS. 6A and 6B, a cable 71A extends from the adapter cable 71 to each terminal 81, and a crimping terminal 71B is provided at an end of the cable 71A. The crimping terminal 71B includes a terminal engaging section 71C that engages the terminal 81 and a cable receiving section 71D in which the cable 71A is inserted. The terminal engaging section 71C and the terminals 81 are connected with each other so that the adapter 7 and the battery 8 are electrically connected. In a state shown in FIG. 6A, the terminal 81 at the right side is a plus terminal, and the terminal 81 at the left side is a minus terminal. Because the terminal engaging section 71C is fixed to the plus terminal 81, the adapter cable 71 can be prevented from coming off the battery 8 due to vibrations or the like that are generated when the power supply device 1 is carried.

A thermistor 88 serving as temperature detecting means is provided on the crimping terminal 71B adjacent to a position where the plus terminal 81 engages the cable 71A. As shown in FIG. 6B, in a state where the thermistor 88 is fixed to an end of a thermistor cable 88A, the thermistor 88 and the thermistor cable 88A are inserted in the cable receiving section 71D and then that section is fixed by crimping (pressure bonding). Epoxide resin is applied in the inner peripheral surface of the cable receiving section 71D, which prevents the thermistor 88 from being damaged by crimping. The thermistor cable 88A is connected with the adapter 7 in order to detect the temperature of the battery 8.

Figure 6D:
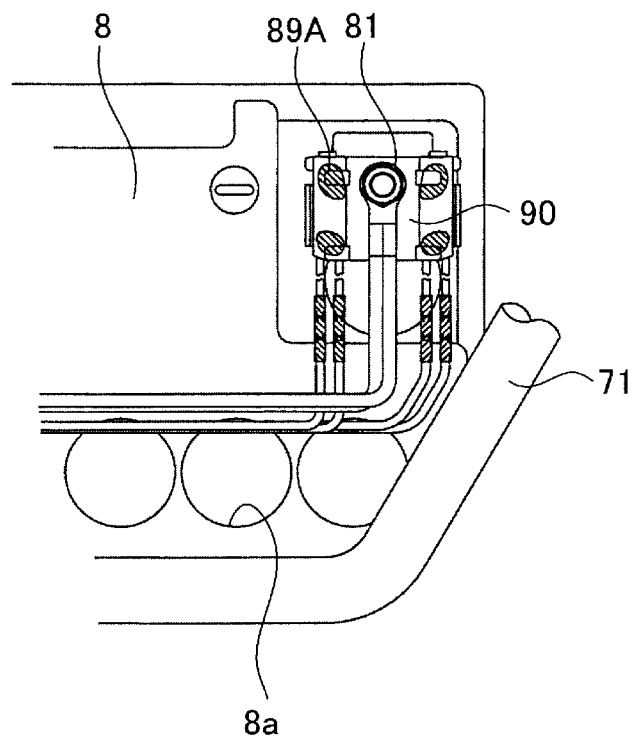
FIG. 6D is a partial enlarged view showing a battery of the power supply device according to the embodiment of the present invention.

As shown in FIGS. 6C and 6D, two thermal protectors 89 are fixed to the minus terminal 81 with a bolt. Cables of the thermal protectors 89 are connected with the adapter 7, so that battery malfunction can be detected. The two thermal protectors 89 are held by a copper holder 90, and are fixed to the copper holder 90 with silicone 89A. The copper holder 90 is fixed to the minus terminal 81 of the adapter 7 with a bolt. One of the thermal protectors 89 is arranged at the cigarette socket provided at the adapter 7 for outputting a DC 12V voltage and at an output path of the battery 8. The remaining of the thermal protectors 89 is arranged at a charging path of the battery 8 and at a power supplying path to the inverter device 5.

When the battery temperature becomes high (for example, 65 degrees Celsius or higher) due to battery malfunction etc., the thermal protectors 89 becomes an open state and the above-mentioned path is cut off. Thus, charge and discharge can be stopped at the time of battery malfunction.

Normally, the temperature of a storage battery does not increase very much even if the storage battery is used continuously for a long time. However, if the storage battery is used under a high or low temperature environment, performance degradation of the battery or a failure of the battery sometimes occurs. Hence, in the present embodiment, usage conditions relating to temperature is provided. As the configuration for controlling temperature, the thermistor 88 is provided for controlling temperature of a power supply to the inverter device 5 side, and the two thermal protectors 89 are provided for controlling outputs to the cigarette socket plug and for protecting the device from high temperature at charging.

Further, for the purpose of improving accuracy of temperature control, the one thermistor 88 is directly mounted on the plus terminal 81 of the battery 8, and the two thermal protectors 89 are directly mounted on the minus terminal 81 of the battery 8. Note that the two thermal protectors 89 are directly mounted on the minus terminal 81. Also, in order to read temperature accurately, the two thermal protectors 89 are directly bonded to the copper holder 90 with silicone 89A and are fixed to the terminal with a nut (bolt). This configuration can prevent dropping off, disconnection, or the like of the thermal protectors 89 and the thermistor 88 due to vibrations etc. during transportation etc., and can improve accuracy of controlling temperature.

As shown in FIGS. 6A through 6D, after the end of the adapter cable 71 is fixed to the terminal 81, the adapter cable 71 is fixed to the support plate 85 with a banding band. This configuration prevents a situation in which a load (force) acts on a portion where the adapter cable 71 is connected with the terminals 81, so that the portion is damaged or broken.

The plurality of gas venting holes 8a is formed in the upper surface of the battery 8 for venting hydrogen gas of the battery 8. The support plate 85 is provided at a position shifted from the gas venting holes 8a.

Figure 25:
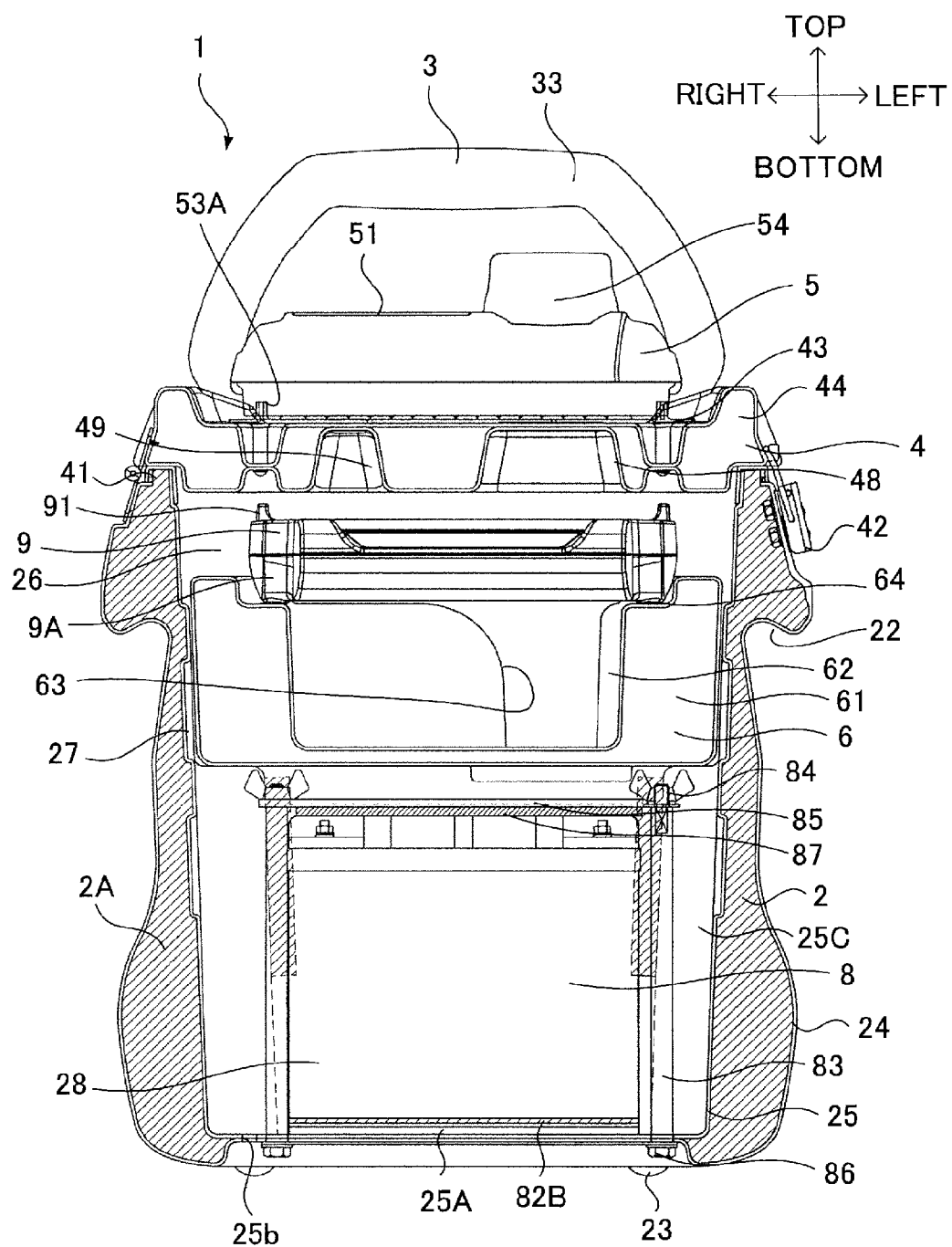
FIG. 25 is a front cross-sectional view showing a power supply device when a sine-wave adapter is accommodated in a main body of the power supply device according to a first modification of the present invention.
Figure 26:
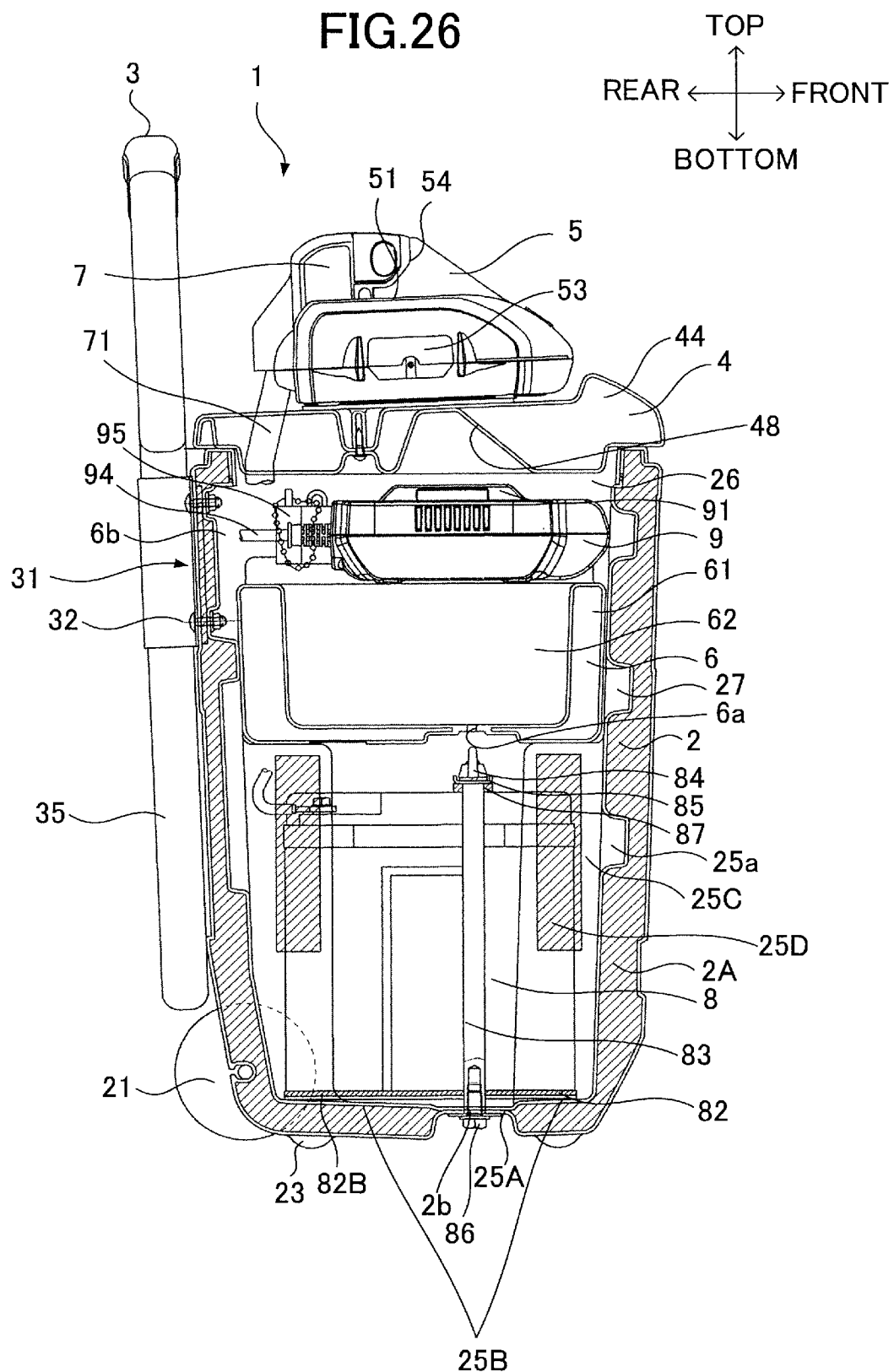
FIG. 26 is a side cross-sectional view showing the power supply device when the inverter device is accommodated in the main body according to the first modification of the embodiment of the present invention.
Figure 27:
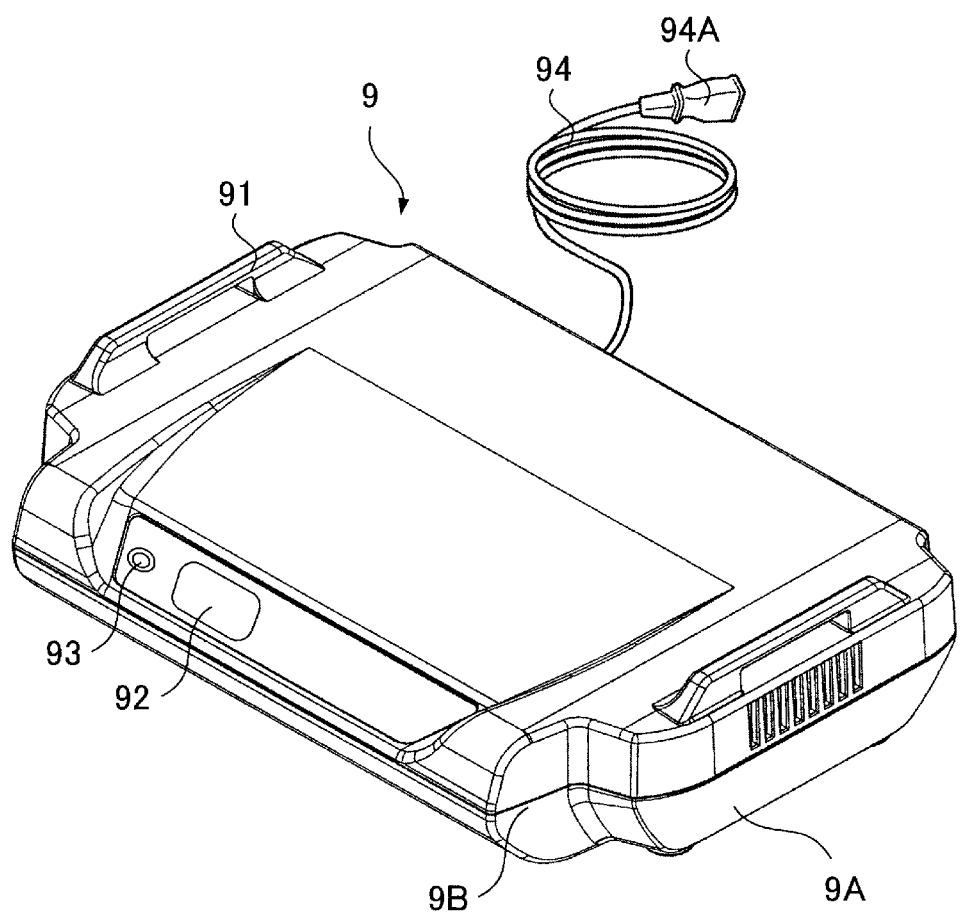
FIG. 27 is a front perspective view showing the sine-wave adapter according to the first modification of the embodiment of the present invention.

The first modification is illustrated in FIGS. 25 through 27. In the first modification, a sine-wave adapter 9 is placed on the middle cover 6, and the inverter device 5 is fixed to the upper cover 4.

The sine-wave adapter 9 is a device configured to convert a square-wave AC voltage outputted from the inverter device 5 to a sine-wave AC voltage. By connecting the output cable 52 of the inverter device 5 with the sine-wave adapter 9 and by acquiring an output from the sine-wave adapter 9, the power supply device 1 can be used as a 100V sine-wave AC power source.

As shown in FIG. 27, the sine-wave adapter 9 includes engaging sections 91 configured to engage the inverter device 5, a display section 92 that displays setting conditions of the sine-wave adapter 9, a setting section 93 that sets output frequency of the sine-wave adapter 9, an output cable 94, and an input section 95 that receives inputs from the outside (FIG. 26). The sine-wave adapter 9 has side protruding sections 9A protruding toward the sides and configured to engage the middle cover 6, and a front protruding section 9B protruding forward and configured to engage the middle cover 6. The engaging sections 91 have shapes that are substantially identical to the shapes of the engaging sections 43A provided at the latch plate 43, and protrude upward. The operator can operate the mount-dismount buttons 53 provided at the inverter device 5 to mount the inverter device 5 on the sine-wave adapter 9 or dismount the inverter device 5 from the sine-wave adapter 9. With this configuration, the inverter device 5 and the sine-wave adapter 9 can be integrally carried, and usage can be broadened.

The display section 92 is provided with two LED lamps. One of the LED lamps turns on when the setting section 93 is set to 50 Hz, and the other one of the LED lamps turns on when the setting section 93 is set to 60 Hz. An insertion plug 94A is provided at an end of the output cable 94. An output from the inverter device 5 is inputted in the input section 95.

The cable accommodating space 6b accommodates the output cable 94 extending from the rear surface of the sine-wave adapter 9 when the sine-wave adapter 9 is placed on the middle cover 6. The side protruding sections 9A of the sine-wave adapter 9 are respectively placed on the receiving sections 64 at the left and right sides. The front protruding section 9B of the sine-wave adapter 9 is placed on the receiving section 64 at the front side. With this configuration, in a state where the sine-wave adapter 9 is placed on the middle cover 6, the sine-wave adapter 9 is immovable on the middle cover 6 in the front-rear direction and in the left-right direction.

In a state where the sine-wave adapter 9 is placed on the middle cover 6 as shown in FIG. 25, there is a possibility that a maximum of three cables passes through the upper-cover groove section 47, the three cables including the adapter cable 71, the output cable 52 extending from the inverter device 5 to the sine-wave adapter 9, and the output cable 94 extending from the sine-wave adapter 9. A cross section of the upper-cover groove section 47 perpendicular to the upper-lower direction has a cross-sectional area through which these three cables can pass.

Figure 28B:
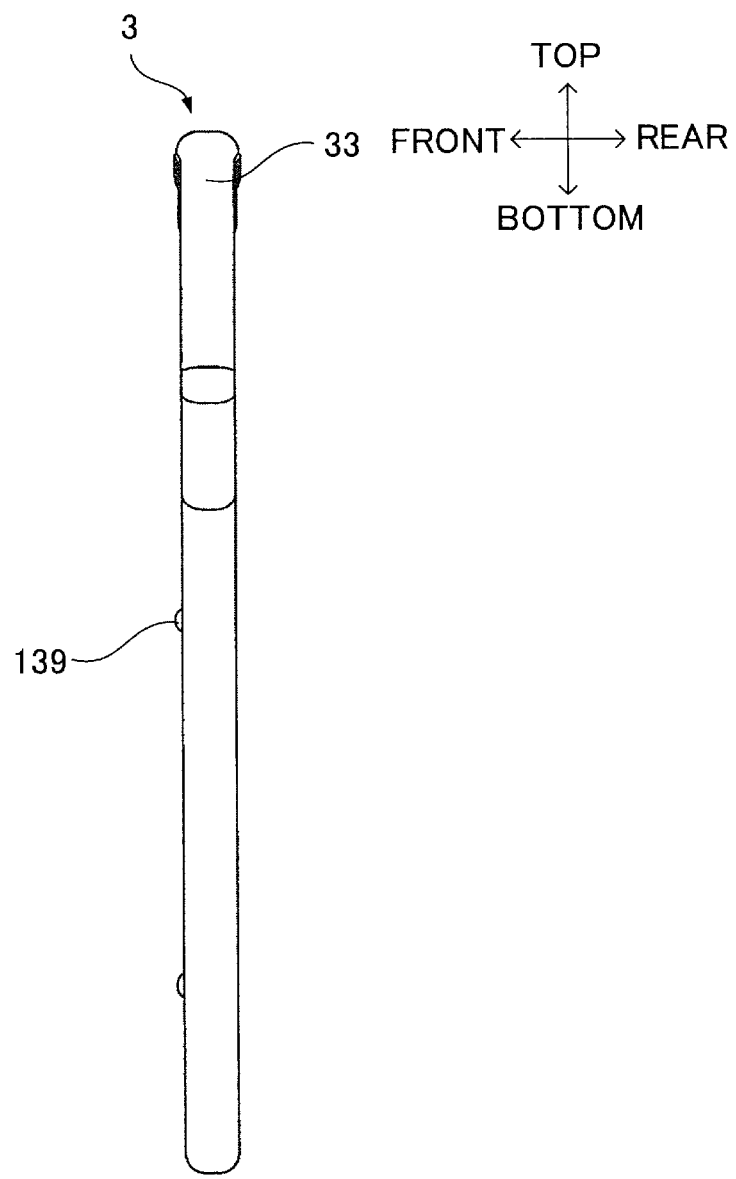
FIG. 28B is a side view showing the handle according to the second modification of the embodiment of the present invention.

A second modification is illustrated in FIGS. 28A and 28B. In the second modification, pressing sections 139 are provided at the handle 3. In the above-described embodiment, a front-side (the main body 2 side) member of the buffer material 34A contacts the outer body 24 to prevent rattles of the handle 3. In the second modification, the pressing sections 139 contact the outer body 24 to prevent rattles of the handle 3.

Two pressing sections 139 are provided at each extending section 35 with a predetermined distance therebetween in the upper-lower direction, and four pressing sections 139 are provided at the handle 3 in total. As shown in FIG. 38, each pressing section 139 protrudes forward (toward the main body 2 side). When the handle 3 is in the retracted position, all of the four pressing sections 139 contact the main body 2. Thus, because the handle 3 contact the outer body 24 at four positions, rattles of the handle 3 can be prevented reliably. When the handle 3 is in the extended position, only the two lower pressing sections 139 contact the outer body 24. Thus, even in a state where the handle 3 is pulled out, rattles of the handle 3 can be prevented.

A rubber grip section 133 is provided at the handle gripping section 33, so that the operator can readily grip the handle gripping section 33.

Figure 29:
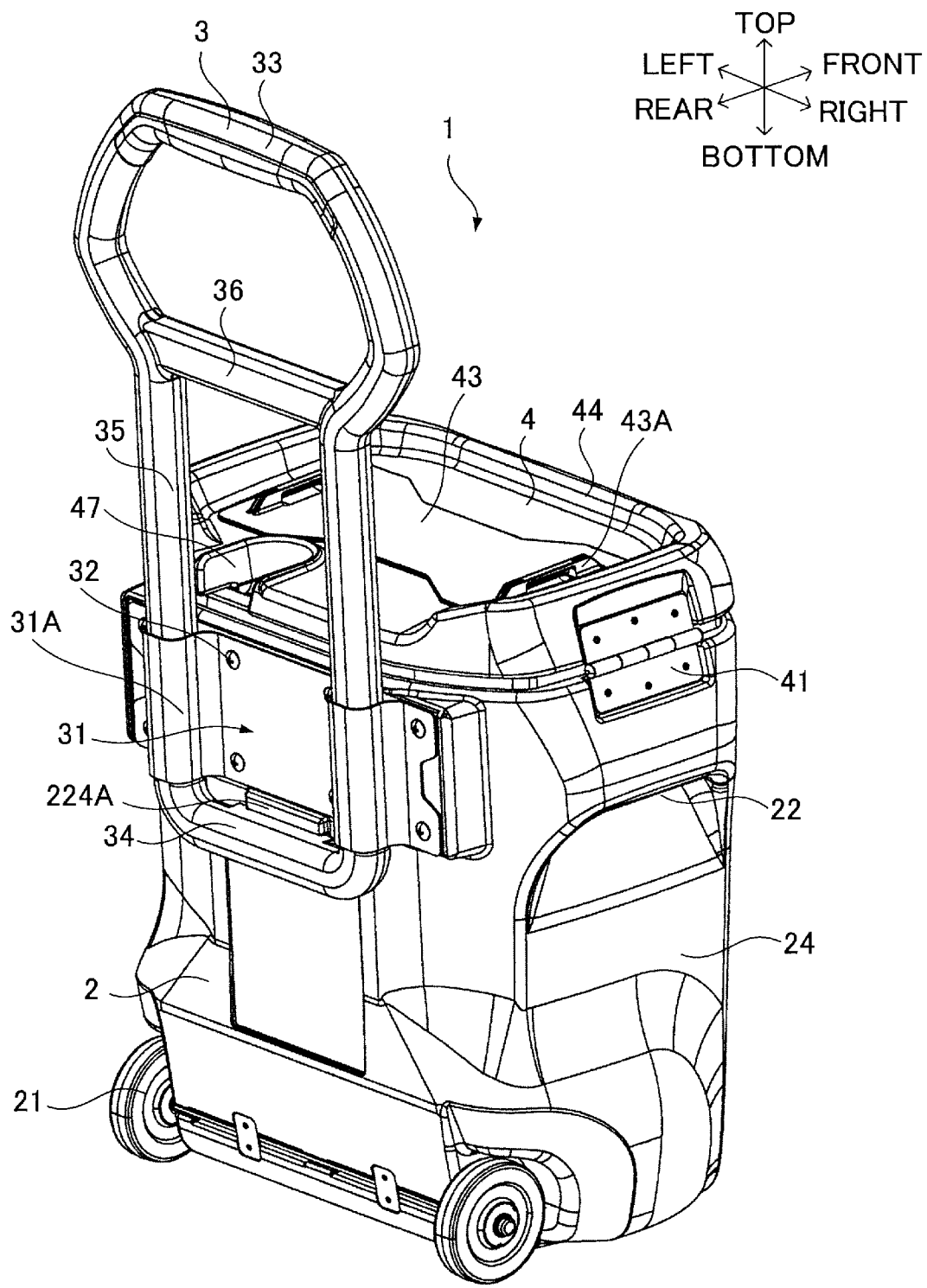
FIG. 29 is a rear perspective view showing a power supply device according to a third modification of the embodiment of the present invention.
Figure 30:
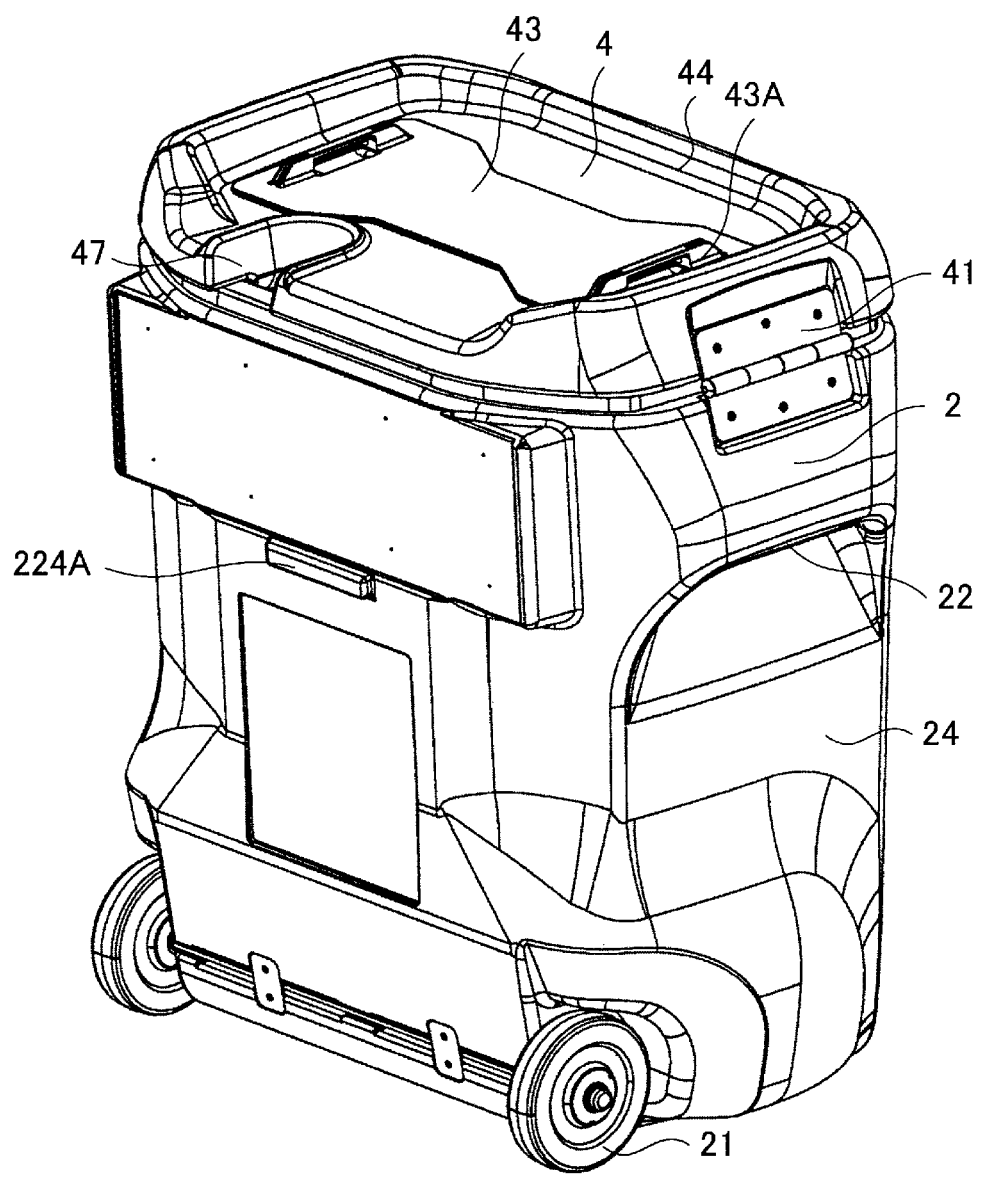
FIG. 30 is a rear perspective view showing a main body of the power supply device according to the third modification of the embodiment of the present invention.
Figure 31:
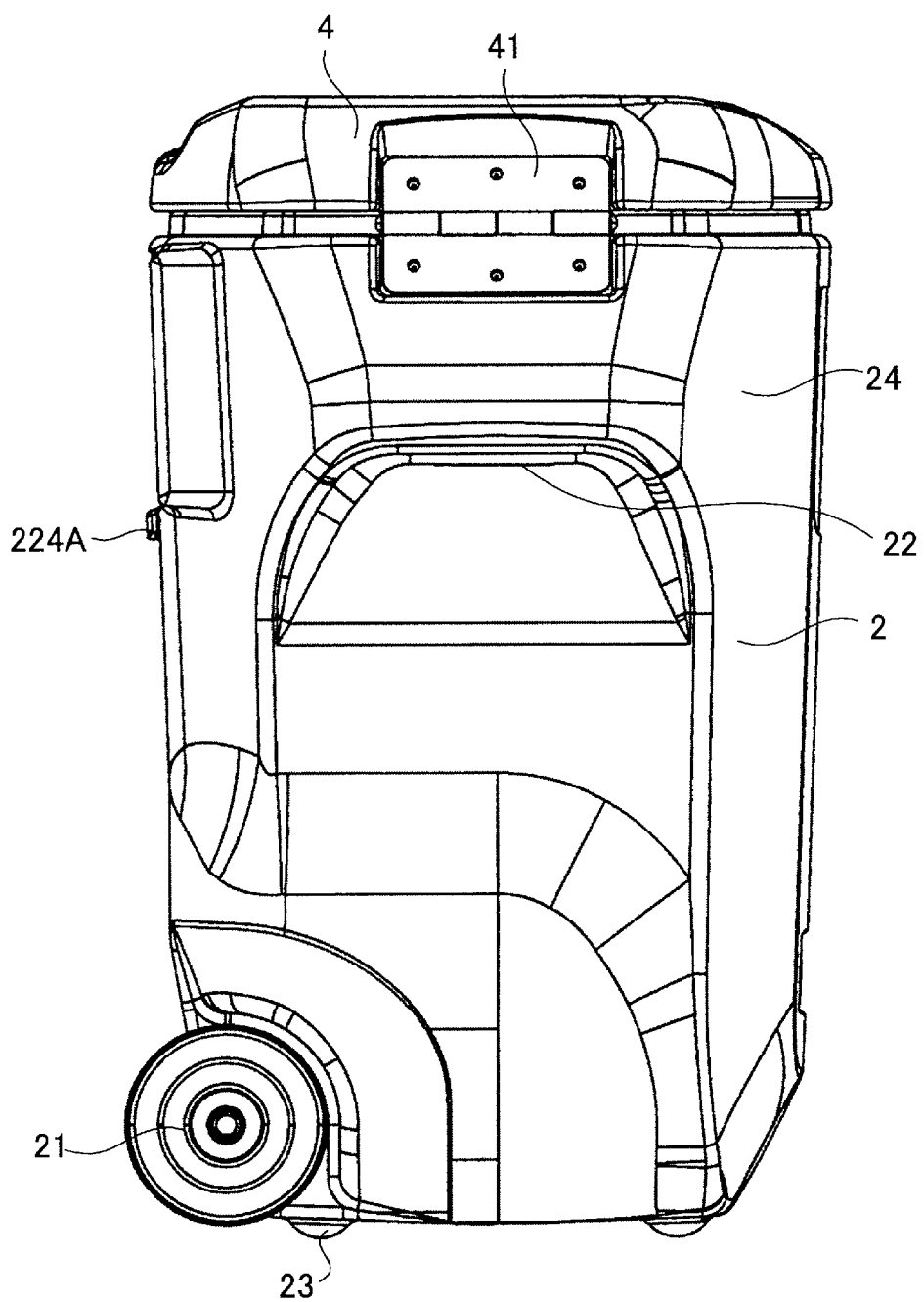
FIG. 31 is a side view showing the main body of the power supply device according to the third modification of the embodiment of the present invention.

A third modification is illustrated in FIGS. 29 through 31. In the above-described embodiment, the abutting section 31B is adopted as a stopper of the handle 3. In the third modification, a protruding section 224A serves as the stopper.

In the third modification, the protruding section 224A is provided to protrude outward from the rear surface of the outer body 24. The end of the buffer material 34A at the outer body 24 side is located at the outer body 24 side of an imaginary line that extends in parallel with the extending sections 35 from the protruding section 224A of the outer body 24 located above the end. That is, the protruding section 224A of the outer body 24 is located farther rearward than the end of the buffer material 34A. With this configuration, when the handle 3 is in the extended position, the protruding section 224A contacts the buffer material 34A. This can suppresses unintended movement of the handle 3 toward the extended position relative to the main body 2.

Unless it creates a problem in strength, as in the third modification, the protruding section 224A may be provided at the main body 2 as an alternative of the abutting section 31B, and the protruding section 224A may contact the abutment section 34, thereby preventing damages to a connection position R between the abutment section 34 and the extending sections 35 with relatively inexpensive configurations. Further, only the shape of the abutment section 34 may be a square (rectangular) shape, and the protruding section 224A may contact the abutment section 34. With this configuration, a contact may be performed smoothly even if the height of the protruding section provided at the main body 2 is low.

According to the above-described power supply device, the following effects can be obtained.

The inverter device 5 and the battery 8 having a large capacity are accommodated in the main body 2 so that the power supply device 1 can be carried. Thus, electric power of AC voltage can be supplied over a long period of time in an area where no electric power of commercial AC voltage is supplied, for example, a disaster area due to a great earthquake. Further, because the power supply device 1 has the rechargeable battery 8, the battery 8 can be charged by connecting the inverter device 5 with a commercial AC power source in an area where electric power of commercial AC voltage is supplied.

The inverter device 5 can be fixed on the upper cover 4. Hence, when the sine-wave adapter 9 is accommodated within the main body 2, the inverter device 5 can be fixed to the engaging sections 43A and arranged on the outer surface of the upper cover 4. Hence, the outer size of the main body 2 can be made small. Further, the power supply device 1 includes the sine-wave adapter 9 that converts a square-wave AC voltage outputted from the inverter device 5 to a sine-wave AC voltage and that outputs the sine-wave AC voltage. Thus, electric power of a sine-wave AC voltage can be supplied.

The sine-wave adapter 9 can be accommodated in the main body 2, thereby realizing the compact power supply device 1. Since the latch plate 43 is provided with the engaging sections 43A for engaging the engagement sections 53A of the mount-dismount buttons 53, the inverter device 5 can be readily fixed on the upper cover 4.

The inverter device 5 can be used standalone separating from the engaging sections 43A of the upper cover 4, thereby providing user friendly power supply device 1.

Either the battery 8 or the battery pack 5C for a power tool can be selectively used in the inverter device 5. An operator can use the battery 8 or the battery pack 5C for a power tool as necessary, which improves the convenience of the power supply device 1.

The adapter 7 having the same connection section 72 as the battery pack 5C for a power tool connects the inverter device 5 with the battery 8. Thus, by providing single accommodating section 54 at the inverter device 5, the adapter 7 or the battery pack 5C for a power tool can be selectively mounted on the accommodating section 54.

When the inverter device 5 is accommodated in the main body 2 and the adapter 7 or the battery pack 5C is mounted on the inverter device 5, the upper cover 4 cannot be closed. This prevents the main body 2 from be filled with hydrogen gas upon generating the same from the battery 8. Even if the adapter 7 is provided with a fuse and the fuse is blowout, hydrogen gas explosion can be avoided.

Because the battery 8 is a lead storage battery for a vehicle use, the battery 8 with a large capacity can be used. Further, because the inverter device 5 can be connected with the battery pack 5C for a power tool, either the battery 8 or the battery pack 5C can be used depending on the usage. If the battery 8 is used, the operating time of an apparatus connected with the power supply device 1 can be made longer than the operating time when the battery pack 5C for a power tool is used. If the battery pack 5C for a power tool is used, the inverter device 5 can be carried while being slung on the shoulder or the like.

The handle 3 is provided at the main body 2 for being gripped to carry the main body 2. The handle 3 is held by the handle holding sections 31A provided at the main body 2. Thus, the power supply device 1 can be moved readily.

The handle 3 includes the first handle member 37 and the second handle member 38. Thus, the handle 3 can be made by blow molding thereby saving costs. In addition, the handle 3 has strength to an extent that the power supply device 1 can be carried by gripping the handle 3 in a state where the battery 8 is accommodated within the main body 2. Further, because the first handle member 37 and the second handle member 38 have an identical shape, the handle members 37 and 38 can be manufactured with the same mold and thus the manufacturing costs can be reduced.

The main body 2 is provided with the abutting section 31B that restricts movement of the handle 3. Thus, even though the handle 3 is manufactured by blow molding, the above-described configuration can prevent a situation in which, when the handle 3 moves, the handle 3 contacts a portion other than the abutting section 31B in the extended position and then the handle 3 is damaged. Further, because a press component is used as the abutting section 31B, the inexpensive abutting section 31B and the handle 3 which is an inexpensive component made by blow molding can be used in combination, thereby reducing the manufacturing costs of the power supply device 1.

The second damper 31D is provided at the abutting section 31B, and the buffer material 34A is provided at the abutment section 34. This reduces collision load that is generated between the abutting section 31B and the handle 3 when the handle 3 is forcefully moved from the retracted position to the extended position. Hence, durability of the handle 3 and the abutting section 31B can be improved.

The buffer material 34A is provided over the entire periphery of the abutment section 34. Thus, even when the main body 2 falls and the handle 3 comes close to the ground, floor, or the like, the buffer material 34A hits the ground, floor, or the like. This softens an impact when the handle 3 hits the ground, floor, or the like, and thus can prevent damages to the handle 3.

Because the buffer material 34A is a rubber damper, the buffer material 34A can be made of inexpensive and simple material.

The handle 3 protrudes from the upper cover 4 at the retracted position. When the power supply device 1 is upside down by 180 degree, a top portion of the handle 3 protruding from the upper cover 4 and the center of gravity G each projected to a plane perpendicular to the upper-lower direction is away from each other such that the power supply device 1 cannot maintain the upside down orientation. If the power supply device 1 is placed at the upside down orientation, the tope portion of the handle 3 is in contact with the ground. At this time, because only the top portion contacts the ground, the power supply device 1 is in an unstable state. Then, the power supply device 1 is brought into tilting until a portion other than the top portion of the handle 3 is in contact with the ground. That is, the power supply device 1 cannot be maintained at the upside down orientation for a long period of time. Hence, even if a power source accommodated in the power supply device 1 is a lead battery, liquid leakage from the battery 8 can be avoided.

The handle 3 is movable between the retracted position and the extended position. The top portion of the handle 3 positioned at the retracted position is located at a position higher than the top edge of the upper cover 4. This prevents the power supply device 1 from being maintained at the upside down orientation and thus effectively prevents the liquid leakage from the battery 8.

Because the wheels 21 are provided at the main body 2, the power supply device 1 can be moved easily.

The latch plate 43 is provided at the upper cover 4. By fixing the inverter device 5 to the upper cover 4, the display panel 51 of the inverter device 5 can be used in an easily viewable state. In addition, access to the inverter device 5 can be facilitated.

Because the battery 8 and the inverter device 5 are accommodated in the main body 2, the battery 8 and the inverter device 5 can be integrally carried.

The engaging sections 43A of the latch plate 43 protrude from the upper cover 4, and the upper cover 4 is provided with the wall section 44 that protrudes farther than the engaging sections 43A. This configuration can prevent the engaging sections 43A from being hit by another object and protect the engaging sections 43A.

The upper surface 4A of the upper cover 4 is slanted downward toward the flat section 4B. With this configuration, when rain water etc. falls on the slanted surface, the rain water flows toward the flat section 4B of the upper cover 4. Hence, rain water etc. can be prevented from being collected on the outer surface of the upper cover 4.

The upper surface 4A of the upper cover 4 is slanted downward toward the flat section 4B at least 1 degree. Hence, rain water etc. can be discharged effectively.

Because the upper-cover groove section 47 is formed in the upper cover 4, the cables connected with the inverter device 5 etc. can pass through the upper-cover groove section 47 inward from outside the main body 2 or outward from inside the main body 2.

Because the peripheral section 47A is provided at the periphery of the upper-cover groove section 47, rain water etc. can be prevented from running into the main body 2 through the upper-cover groove section 47.

The first depressed section 48 has a shape following the shape of the accommodating section 54. Thus, in a state where the adapter 7 is mounted on the accommodating section 54, the lower surface 4C around the first depressed section 48 contacts the adapter 7, and the opening 2a cannot be closed with the upper cover 4.

The inverter device 5 is accommodated in the upper chamber 26, the middle cover 6 is accommodated in the middle chamber 27, and the battery 8 is accommodated in the lower chamber 28. Hence, the battery 8, the inverter device 5, and the middle cover 6 can be accommodated compactly in the main body 2.

The cable accommodating space 6b is formed such that the cable accommodating space 6b opposes the inverter device 5 when the inverter device 5 is placed on the middle cover 6. Thus, the cable accommodating space 6b can accommodate the adapter cable 71 for connecting the inverter device 5 with the battery 8, and forceful folding of the adapter cable 71 can be avoided.

Because the power supply device 1 further includes the sine-wave adapter 9 that can be accommodated in the upper chamber 26, electric power of a sine-wave AC voltage can be supplied from the power supply device 1.

The middle cover 6 is provided within the main body 2 for dividing the space within the main body 2 into the upper chamber 26 and the lower chamber 28. The battery 8 is accommodated in the lower chamber 28, and the inverter device 5 can be accommodated in the upper chamber 26. Hence, the main body 2 can compactly accommodate the battery 8 and the inverter device 5.

The middle cover 6 is provided with the receiving section 64 for receiving the inverter device 5, and the inverter device 5 is held by the receiving section 64 and the upper cover 4. Hence, it is unnecessary to provide another member for fixing the inverter device 5 within the main body 2.

The battery 8 is in electrical connection with the inverter device 5 via the adapter 7. The middle cover 6 is formed with the adapter accommodating section 62 located at a position lower than the receiving section 64. The adapter accommodating section 62 is capable of accommodating the adapter 7. By accommodating the adapter 7 within the main body 2, outside impact directly exerted on the adapter 7 can be avoided.

Because the inverter device 5 on which the adapter 7 is mounted on the accommodating section 54 can be placed on the receiving section 64, the adapter 7 and the inverter device 5 can be compactly accommodated in the main body 2.

The cable accommodating space 6b is formed such that the cable accommodating space 6b opposes the sine-wave adapter 9 when the sine-wave adapter 9 is placed on the middle cover 6. Thus, the cable accommodating space 6b can accommodate a cable for connecting the sine-wave adapter 9 with the battery 8, and forceful folding of the cable can be avoided.

Because the middle-cover groove section 63 is formed in the middle cover 6, cables etc. connected with the battery 8 are allowed to pass through the middle-cover groove section 63 from the lower side to the upper side, or from the upper side to the lower side of the middle cover 6.

Because the through hole 6a is formed in the middle cover 6, rain water etc. that has entered the upper chamber 26 can flow to the lower chamber 28. Further, even if by any chance hydrogen gas emanates from the battery 8 in the lower chamber 28, the hydrogen gas can be vented to the upper chamber 26.

Because the buffer material 2A is filled between the outer body 24 and the inner body 25, temperature changes within the main body 2 can be suppressed, and performance of the battery 8 can be stabilized. Further, the buffer material 2A can absorb an impact that is generated when another object hits the outer body 24, and thus the battery 8 and the inverter device 5 accommodated in the main body 2 can be protected.

Because the buffer material 2A is provided in the main body 2, the battery 8 accommodated in the main body 2 can be protected, and the liquid leakage from the battery 8 due to an impact from outside can be prevented.

The main body 2 is constituted by the inner body 25 defining the space within the main body 2 and the buffer material 2A is provided outside of the inner body 25. Thus, the battery 8 can be protected by the buffer material 2A and the inner body 25, and the liquid leakage from the battery 8 due to the impact from outside can be prevented.

The main body 2 is constituted by the outer body 24 serving as the outer shell. The buffer material 2A is provided between the inner body 25 and the outer body 24. Hence, the battery 8 is protected by the outer body 24, the inner body 25, and the buffer material 2A, thereby preventing the liquid leakage from the battery 8 due to the impact from outside.

The outer body 24 is provided with the outer body side abutting section 25E depressed upward, and the inner body 25 is provided with the inner body side abutting section 24A protruding downward at a position facing the outer body side abutting section 25E. Thus, the position of the inner body 25 relative to the outer body 24 can readily be decided upon assembling the main body 2.

The drainage hole 25b is formed in the inner body 25, and the inner body 25 has the slant sections 25B slanted downward toward the drainage hole 25b. Thus, rain water that has entered the main body 2 can flow to the drainage hole 25b and can be discharged to the outside.

The through hole 2b extending through the outside of the main body 2 and the inside of the same is formed at the bottom surface of the main body 2. The slant section 25B slanted downward toward the through hole 2b is provided on the bottom surface of the inner body 25. Hence, rain water intruding in the main body 2 flows to the through hole 2b and then is discharged outside of the main body 2.

The abutting section 25A is provided at a vertical position above the slant section 25B, and the through hole 2b is formed at the abutting section 25A. Hence, rain water intruding in the main body 2 flows to the through hole 2b formed at the abutting section 25A, and then is discharged outside of the main body 2.

The buffer material 2A has thermal insulation properties, preventing the temperature variation in the main body 2 and thus stabilizing the performance of the battery 8. The buffer material 2A absorbs the impact upon contacting the outer body 24 with other member, which protects the battery 8 and the inverter device 5 each accommodated in the main body 2. Since the battery 8 is accommodated in the main body 2 and the inverter device 5 can be accommodated in the main body 2, the battery 8 and the inverter device 5 are integrally carried.

Because the slant sections 25B are slanted at 1 degree or more with respect to the horizontal surface, rain water that has entered the main body 2 can flow to the drainage hole 25b efficiently.

The battery 8 is supported by the battery shafts 83 at the left and right sides thereof, and contacts the restricting sections 82A at the front and rear sides thereof. Thus, the battery 8 can be stably held in the left-right direction, and the battery 8 can also be stably positioned in the front-rear direction intersecting the left-right direction because of contacts between the ends of the battery 8 and the restricting sections 82A.

The battery plate 82 is formed with the shaft through hole 82a at both ends thereof in the right-left direction and is provided with the restricting sections 82A formed at both ends thereof in the front-rear direction. The bottom portion of the battery shaft 83 is inserted into the shaft through hole 82a. Hence, the battery 8 can be stably held not only in the right-left direction but also in the front-rear direction because of the abutment with the restricting section 82A.

The slippage preventing members 25D is provided between the battery plate 82 and the ribs 25C (the inner body 25) for preventing the battery plate 82 from slipping relative to the inner body 25. Hence, the battery plate 82 can be stably held relative to the inner body 25.

The first antislip member 82B is provided between the battery plate 82 and the battery 8 for preventing the battery 8 from slipping relative to the battery plate 82. Hence, the battery 8 can be stably held relative to the battery plate 82.

Because the first antislip member 82B is made from rubber damper, hold of the battery plate 82 relative to the inner body 25 and hold of the battery 8 relative to the battery plate 82 can readily and effectively realized.

The slippage preventing members 25D and 82B are rubber dampers. Hence, the battery plate 82 can be held relative to the inner body 25 and the battery 8 can be held relative to the battery plate 82 easily and effectively.

The elastic material 87 provided on the surface of the support plate 85 has a longitudinal length longer than the distance between the terminals 81. Thus, even when the support plate 85 is detached from the battery shafts 83 for replacing the battery 8 and the support plate 85 is dropped on the terminals 81 by mistake, a short circuit can be prevented.

Because the inverter device 5 is mountable on the upper cover 4, the inverter device 5 can be cooled by outer atmosphere, thereby preventing heat of the inverter device 5 from staying within the main body 2.

While the invention has been described in detail with reference to the above aspects thereof, it would be apparent to those skilled in the art that various changes and modifications may be made therein without departing from the scope of the claims.

In the above-described embodiment, the main body 2 can accommodate therein either one of the inverter device 5 and the sine-wave adapter 9. However, the height of the main body 2 may be increased so that the main body 2 can accommodate therein both of the inverter device 5 and the sine-wave adapter 9. In this case, too, it is preferable that the upper cover 4 be so configured that the upper cover 4 cannot be closed in a state where the adapter 7 is mounted in the accommodating section 54.

Although, in the above-described embodiment, the single drainage hole 25b is formed at the abutting section 25A, a plurality of drainage holes may be formed. With this configuration, even when a large amount of water enters the main body 2, water can be discharged to the outside promptly.

Although urethane is adopted as the buffer material 2A in the above-described embodiment, another material such as polystyrene may be adopted. Alternatively, the buffer material 2A may be omitted.

Although polyethylene is adopted as the inner body 25 in the above-described embodiment, polypropylene may be adopted as the inner body 25.

In the above-described embodiment, the first handle member 37 and the second handle member 38 are combined to form the handle 3. However, the handle 3 may be made of metal.

In the above-described embodiment, the buffer material 34A is provided at the handle 3, and the second damper 31D is provided at the abutting section 31B. However, either one of the buffer material 34A and the second damper 31D may be provided.

Further, a buffer material may be provided at the lower surface of the reinforcing member 36. With this configuration, when the operator presses the handle 3 down, the upper surface of the holding section 31 and the buffer material contact, and an impact can be softened.

In the above-described embodiment, the upper-cover groove section 47 is provided at the rear surface of the upper cover 4. However, the upper-cover groove section 47 may be provided any surface other than the side surface at which the hinge mounting section 46 is provided. Further, a plurality of the upper-cover groove sections 47 may be provided.

In the above-described embodiment, the inverter device 5 can be placed on the middle cover 6. However, members corresponding to the engaging sections 43A may be provided at the middle cover 6 so that the inverter device 5 can be fixed to the middle cover 6. Further, an engaging section may be provided at the middle cover 6 for engaging the bottom surface of the sine-wave adapter 9 and for fixing the sine-wave adapter 9.

In the above-described embodiment, the adapter 7 and a portion of the adapter cable 71 are accommodated in the adapter accommodating section 62. However, the battery pack 5C may be accommodated in the adapter accommodating section 62. Further, the adapter accommodating section 62 may be so configured that the adapter 7 and the battery pack 5C can be accommodated at the same time.

In the above-described embodiment, the adapter 7 is accommodated in the adapter accommodating section 62 such that the adapter 7 is placed on the bottom surface 6A of the middle cover 6. However, a member for fixing the adapter 7 may be provided at the adapter accommodating section 62, so that the adapter 7 is immovable.

In the above-described embodiment, the bottom surface 6A of the middle cover 6 is a horizontal surface. However, the bottom surface 6A may be slanted downward toward the through holes 6a. This enables a structure where water is further unlikely to be collected at the adapter accommodating section 62.

Although, in the above-described embodiment, the middle-cover groove section 63 is provided at the surrounding wall 61 at the rear side, the middle-cover groove section 63 may be provided at the surrounding wall 61 at another side. Further, a plurality of middle-cover groove sections 63 may be provided at the surrounding wall 61.

Further, the main body 2 may be provided with a cooling function. Specifically, an inlet for external air may be provided at one side of the main body 2, and a discharging fan may be provided at the side opposing the one side. With this configuration, even if the battery 8 and the sine-wave adapter 9 generate heat, temperature increase within the main body 2 can be suppressed.

In the above-described embodiment, a temperature detecting device having temperature detecting means, which is a thermistor, is applied to the power supply device 1. However, the temperature detecting device may be applied to a device other than the power supply device 1.

The invention claimed is:

1. A power supply device comprising: a main body; a first battery configured to be accommodated in the main body; and a power supply unit configured to be attached to and detached from the main body and configured to be selectively connected to one of the first battery and a second battery, the power supply unit being configured to be supplied with an electric power from the first battery when the power supply unit is connected to the first battery, and the power supply unit being configured to be supplied with an electric power from the second battery when the power supply unit is disconnected from the first battery and connected to the second battery in a state where the power supply unit is detached from the main body.

2. The power supply device according to claim 1, wherein the power supply unit is configured to convert the electric power supplied from one of the first battery and the second battery, and is configured to output the converted electric power.

3. The power supply device according to claim 1, wherein the second battery is a battery pack for a power tool.

4. The power supply device according to claim 1, wherein the power supply unit is configured to charge the first battery.

5. The power supply device according to claim 4, wherein the power supply unit includes a power cable configured to be connected to an external power source, the power supply unit being configured to charge the first battery in a state where the power cable is connected to the external power source.

6. The power supply device according to claim 1, wherein the main body is formed with an opening and is provided with a cover member configured to open and close the opening, the power supply unit being configured to be accommodated in the main body through the opening, the cover member being configured to close the opening in a state where the power supply unit is accommodated in the main body.

* * * * *